(12) United States Patent
Hata et al.

(10) Patent No.: US 8,835,980 B2
(45) Date of Patent: Sep. 16, 2014

(54) SEMICONDUCTOR WAFER, PHOTOELECTRIC CONVERSION DEVICE, METHOD OF PRODUCING SEMICONDUCTOR WAFER, AND METHOD OF PRODUCING PHOTOELECTRIC CONVERSION DEVICE

(75) Inventors: Masahiko Hata, Ibaraki (JP); Taro Itatani, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 176 days.

(21) Appl. No.: 13/310,614

(22) Filed: Dec. 2, 2011

(65) Prior Publication Data

US 2012/0074463 A1 Mar. 29, 2012

Related U.S. Application Data

(63) Continuation-in-part of application No. PCT/JP2010/003721, filed on Jun. 3, 2010.

(30) Foreign Application Priority Data

Jun. 5, 2009 (JP) ................................ 2009-136665

(51) Int. Cl.
| | | |
|---|---|---|
| H01L 31/0264 | (2006.01) | |
| H01L 31/0392 | (2006.01) | |
| H01L 31/052 | (2014.01) | |
| H01L 31/18 | (2006.01) | |
| H01L 31/076 | (2012.01) | |
| H01L 27/142 | (2014.01) | |

(52) U.S. Cl.
CPC ........... *H01L 31/0522* (2013.01); *Y02E 10/544* (2013.01); *Y02E 10/52* (2013.01); *H01L 31/0392* (2013.01); *H01L 31/1852* (2013.01); *H01L 31/076* (2013.01); *Y02E 10/548* (2013.01); *H01L 27/142* (2013.01)
USPC ................... 257/184; 257/183; 257/E27.122; 257/E27.123; 257/E27.124; 257/E27.126; 438/94; 438/478

(58) Field of Classification Search
USPC ................... 257/183, 184, E21.09, E29.068, 257/E31.004, E27.122–E27.124, E27.126; 438/478, 94
See application file for complete search history.

(56) References Cited

U.S. PATENT DOCUMENTS 2,949,498 A * 8/1960 Jackson ......................... 136/244
4,614,564 A 9/1986 Sheldon et al.
(Continued)

FOREIGN PATENT DOCUMENTS

| JP | 60-210831 A | 10/1985 |
| JP | 61-094318 A | 5/1986 |

(Continued)

OTHER PUBLICATIONS

Translation of International Preliminary Report on Patentability and Written Opinion dated Jan. 26, 2012, in International Application No. PCT/JP2010/003721.

(Continued)

*Primary Examiner* — Ermias Woldegeorgis
(74) *Attorney, Agent, or Firm* — Sughrue Mion, PLLC

(57) ABSTRACT

Provided is a semiconductor wafer including: a base wafer containing silicon; an inhibitor that has been formed on the base wafer, has an aperture in which a surface of the base wafer is exposed, and inhibits crystal growth; and a light-absorptive structure that has been formed inside the aperture in contact with a surface of the base wafer exposed inside the aperture, where the light-absorptive structure includes a first semiconductor and a second semiconductor.

4 Claims, 10 Drawing Sheets

(56) References Cited

U.S. PATENT DOCUMENTS

| | | |
|---|---|---|
| 5,009,719 A | 4/1991 | Yoshida |
| 5,094,697 A | 3/1992 | Takabayashi et al. |
| 5,403,771 A | 4/1995 | Nishida et al. |
| 5,578,141 A * | 11/1996 | Mori et al. ............... 136/251 |
| 6,153,823 A * | 11/2000 | Shiozaki et al. ............ 136/249 |
| 2008/0070355 A1 | 3/2008 | Lochtefeld et al. |
| 2010/0308376 A1 | 12/2010 | Takada et al. |
| 2011/0006343 A1 | 1/2011 | Hata et al. |
| 2011/0006368 A1 | 1/2011 | Hata et al. |
| 2011/0006399 A1 | 1/2011 | Takada et al. |
| 2011/0012175 A1 | 1/2011 | Takada et al. |
| 2011/0018030 A1 | 1/2011 | Takada et al. |
| 2011/0037099 A1 | 2/2011 | Takada et al. |
| 2011/0180903 A1 | 7/2011 | Hata |
| 2011/0180949 A1 | 7/2011 | Bierdel et al. |
| 2011/0186911 A1 | 8/2011 | Hata |
| 2011/0266595 A1 | 11/2011 | Hata |

FOREIGN PATENT DOCUMENTS

| | | | |
|---|---|---|---|
| JP | 61-135115 A | | 6/1986 |
| JP | 61-188927 A | | 8/1986 |
| JP | 62-051272 A | | 3/1987 |
| JP | 62-102567 A | | 5/1987 |
| JP | 62-176160 A | | 8/1987 |
| JP | 01-094677 A | | 4/1989 |
| JP | 02-218174 A | | 8/1990 |
| JP | 03-094477 A | | 4/1991 |
| JP | 04-225282 A | | 8/1992 |
| JP | 05-003332 A | | 1/1993 |
| JP | 07-321357 A | | 12/1995 |
| JP | 2000332229 A | * | 11/2000 |
| JP | 2001-093849 A | | 4/2001 |
| JP | 2008-124381 A | | 5/2008 |
| WO | 2009/035746 A2 | | 3/2009 |

OTHER PUBLICATIONS

Office Action issued Dec. 17, 2013 in corresponding Japanese Patent Application No. 2010-128367 with English translation.

* cited by examiner

SEMICONDUCTOR WAFER, PHOTOELECTRIC CONVERSION DEVICE, METHOD OF PRODUCING SEMICONDUCTOR WAFER, AND METHOD OF PRODUCING PHOTOELECTRIC CONVERSION DEVICE

The contents of the following Japanese patent application and PCT patent application are incorporated herein by reference:
JP2009-136665 filed on Jun. 5, 2009, and
PCT/JP2010/003721 filed on Jun. 3, 2010.

TECHNICAL FIELD

The present invention relates to a semiconductor wafer, a photoelectric conversion device, a method of producing a semiconductor wafer, and a method of producing a photoelectric conversion device.

BACKGROUND ART

Patent Document 1 discloses a method of producing a tandem hetero photoelectric conversion element. In this production method, V-shaped grooves are formed on a Si wafer, a PN junction is formed on the Si wafer, and a Group III-V compound semiconductor is epitaxially grown on the Si wafer. Patent Document 1 discloses a method of epitaxially growing the Group III-V compound semiconductor under a condition of the growth temperature of 500 degrees centigrade or below and the incident flux ratio of the Group III element to the Group III element of 15 or above.
Patent Document 1: JPH5-3332 A

SUMMARY OF THE INVENTION

Problems to be Solved by the Invention

The photoelectric conversion efficiency of photoelectric conversion devices such as solar cells is largely affected by the crystallinity of semiconductor crystals including a space-charge region in which electromotive force of the photoelectric conversion element is to be caused. In particular, when compound semiconductor crystals are epitaxially grown on the Si wafer, the crystallinity of the compound semiconductor tends to be degraded attributed to the difference in lattice constant between the Si wafer and the compound semiconductor. When the crystallinity is degraded, the photoelectric conversion efficiency of the photoelectric conversion device will be lowered.

Means for Solving the Problems

For a solution to the above-mentioned problems, according to the first aspect related to the present invention, provided is a semiconductor wafer including: a base wafer containing silicon; an inhibitor that has been formed on the base wafer, has an aperture in which a surface of the base wafer is exposed, and inhibits crystal growth; and a light-absorptive structure that has been formed inside the aperture in contact with a surface of the base wafer exposed inside the aperture, where the light-absorptive structure includes a first semiconductor and a second semiconductor, where the first semiconductor includes: a first-conductivity-type first semiconductor; a second-conductivity-type first semiconductor that has been formed directly or indirectly on the first-conductivity-type first semiconductor and has a conductivity type opposite to the conductivity type of the first-conductivity-type first semiconductor; and a low-carrier-concentration first semiconductor that has been formed between the first-conductivity-type first semiconductor and the second-conductivity-type first semiconductor and is lower in effective carrier concentration than the first-conductivity-type first semiconductor and the second-conductivity-type first semiconductor; and the second semiconductor includes: a first-conductivity-type second semiconductor that lattice-matches or pseudo-lattice-matches the second-conductivity-type first semiconductor and has a conductivity type opposite to the conductivity type of the second-conductivity-type first semiconductor; a second-conductivity-type second semiconductor that has been formed directly or indirectly on the first-conductivity-type second semiconductor and has a conductivity type opposite to the conductivity type of the first-conductivity-type second semiconductor; and a low-carrier-concentration second semiconductor that has been formed between the first-conductivity-type second semiconductor and the second-conductivity-type second semiconductor and is lower in effective carrier concentration than the first-conductivity-type second semiconductor and the second-conductivity-type second semiconductor. The configuration is also possible in which the inhibitor includes a plurality of the apertures, and the semiconductor wafer comprises a plurality of the light-absorptive structures formed in the plurality of apertures.

The semiconductor wafer may be such that the light-absorptive structure further includes a third semiconductor, and the third semiconductor includes: a first-conductivity-type third semiconductor lattice-matching or pseudo-lattice-matching the second-conductivity-type second semiconductor; a second-conductivity-type third semiconductor that has been formed directly or indirectly on the first-conductivity-type third semiconductor and has a conductivity type opposite to the conductivity type of the first-conductivity-type third semiconductor, and a low-carrier-concentration third semiconductor that has been formed between the first-conductivity-type third semiconductor and the second-conductivity-type third semiconductor and is lower in effective carrier concentration than the first-conductivity-type third semiconductor and the second-conductivity-type third semiconductor. The semiconductor wafer may be such that the first semiconductor includes a material having a first band gap, the second semiconductor includes a material having a second band gap larger than the first band gap, and the third semiconductor includes a material having a third band gap larger than the second band gap.

In addition, for example, the first semiconductor is made of $C_{x1}Si_{y1}Ge_{z1}Sn_{1-x1-y1-z1}$ ($0 \le x < 1$, $0 \le y1 \le 1$, $0 \le z1 < 1$, and $0 < x1+y1+z1 \le 1$), the second semiconductor is made of $Al_{x2}In_{y2}Ga_{1-x2-y2}As_{z2}P_{w1}N_{1-z2-w1}$ ($0 \le x2 \le 1$, $0 \le y2 \le 1$, $0 \le x2+y2 \le 1$, $0 \le z2 \le 1$, $0 \le w1 \le 1$, and $0 \le z2+w1 \le 1$), and the third semiconductor is made of $Al_{x3}In_{y3}Ga_{1-x3-y3}As_{z3}P_{1-z3}$ ($0 \le x3 \le 1$, $0 \le y3 \le 1$, $0 \le z3 \le 1$, and $0 \le x3+y3 \le 1$).

In one example, the light-absorptive structure excites a carrier under irradiation with light, and a recombination repressor layer repressing recombination of the carrier is provided in at least one position selected from between the base wafer and the first-conductivity-type first semiconductor; between the second-conductivity-type first semiconductor and the first-conductivity-type second semiconductor; between the second-conductivity-type second semiconductor and the first-conductivity-type third semiconductor; and on a plane opposite to a plane of the second-conductivity-type third semiconductor, the latter plane being in contact with the low-carrier-concentration third semiconductor. The semiconductor wafer may further include a tunnel junction layer including a P-type impurity layer doped with a P-type impurity in a high concentration and an N-type impurity layer doped with an N-type impurity in a high concentration in at least one position selected from between the second-conductivity-type first semiconductor and the first-conductivity-type second semiconductor and between the second-conductivity-type second semiconductor and the first-conductivity-type third semiconductor. The semiconductor wafer may further include a recombination repressor that has been formed in contact with a side wall of the light-absorptive structure and represses recombination of the carrier on the side wall.

The semiconductor wafer may also be such that one or more semiconductors selected from among the first semiconductor, the second semiconductor, and the third semiconductor have a composition distribution that causes a larger band gap at position distanced farther from the centers of planes respectively of the first semiconductor, the second semiconductor, and the third semiconductor that are parallel to the base wafer. It is also possible that a composition of the first semiconductor varies depending upon the distance from the base wafer in the direction in which the first semiconductor and the second semiconductor are stacked. In an example, the first semiconductor has a composition in which the ratio of silicon decreases as the distance from the base wafer increases.

According to the second aspect related to the present invention, provided is a photoelectric conversion device that comprises the semiconductor wafer as set forth in the first aspect and converts incident light on the light-absorptive structure into electric power. The photoelectric conversion device may further include a light focusing section that focuses and inputs at least part of the incident light onto the light-absorptive structure. For example, the light focusing section focuses and inputs, to the low-carrier-concentration first semiconductor, light of a first color region contained in the incident light, and focuses and inputs, to the low-carrier-concentration second semiconductor, light of a second color region being a shorter wavelength region than the first color region.

The photoelectric conversion device may further include: a transparent electrode provided on a plane of the light-absorptive structure, to which plane the incident light is inputted; and a wire connected to the transparent electrode, where the wire is arranged so as not to overlap a path along which the incident light is incident on the transparent electrode. In the photoelectric conversion device, it is also possible such that the silicon contained in the base wafer is electrically coupled with the light-absorptive structure, and an electromotive force is generated between the transparent electrode and the silicon under incidence of the incident light. In the photoelectric conversion device, it is also possible such that the base wafer includes a well region in which the base wafer is electrically isolated from a bulk region of the silicon and electrically coupled with the light-absorptive structure, and the photoelectric conversion device generates an electromotive force between the transparent electrode and the well region under incidence of the incident light.

The photoelectric conversion device may further include: an optical film that covers a surface of the light focusing section, and absorbs or reflects light of a wavelength longer than the wavelength corresponding to the band gap of the first semiconductor. The photoelectric conversion device may further include: a radiation-resistant film containing heavy metal, positioned on a path along which the incident light is inputted on the light-absorptive structure.

In the photoelectric conversion device, it is also possible such that the inhibitor includes a plurality of the apertures, and the photoelectric conversion device has a plurality of the light-absorptive structures formed in the plurality of apertures, and also has the light focusing sections respectively corresponding to the plurality of light-absorptive structures. The plurality of light-absorptive structures may be connected to each other either in series or in parallel. In an example, the plurality of light-absorptive structures connected to each other either in series or in parallel are connected either in series or in parallel to other light-absorptive structures connected to each other either in series or in parallel.

According to the third aspect related to the present invention, provided is a method of producing a semiconductor wafer, including: forming an inhibitor directly or indirectly on a base wafer containing silicon; forming, through the inhibitor, an aperture in which a surface of the base wafer is exposed; forming a first-conductivity-type first semiconductor inside the aperture; forming a low-carrier-concentration first semiconductor directly or indirectly on the first-conductivity-type first semiconductor; forming, directly or indirectly on the low-carrier-concentration first semiconductor, a second-conductivity-type first semiconductor having a conductivity type opposite to the conductivity type of the first-conductivity-type first semiconductor; forming, directly or indirectly on the second-conductivity-type first semiconductor, a first-conductivity-type second semiconductor lattice-matching or pseudo lattice-matching the second-conductivity-type first semiconductor; forming a low-carrier-concentration second semiconductor directly or indirectly on the first-conductivity-type second semiconductor; and forming, directly or indirectly on the low-carrier-concentration second semiconductor, a second-conductivity-type second semiconductor having a conductivity type opposite to the conductivity type of the first-conductivity-type second semiconductor.

The low-carrier-concentration first semiconductor has a lower effective carrier concentration than the effective carrier concentrations of the first-conductivity-type first semiconductor and the second-conductivity-type first semiconductor, and the low-carrier-concentration second semiconductor has an effective carrier concentration lower than the effective carrier concentrations of the first-conductivity-type second semiconductor and the second-conductivity-type second semiconductor. The first semiconductor may be heated between the forming of the first semiconductor and the forming of the second semiconductor.

The method of producing a semiconductor wafer may further include: forming a first-conductivity-type third semiconductor directly or indirectly on the second-conductivity-type second semiconductor; forming a low-carrier-concentration third semiconductor directly or indirectly on the first-conductivity-type third semiconductor; and forming, directly or indirectly on the low-carrier-concentration third semiconductor, a second-conductivity-type third semiconductor having a conductivity type opposite to the conductivity type of the first-conductivity-type third semiconductor.

According to the fourth aspect related to the present invention, provided is a method of producing a photoelectric conversion device including: forming light-absorptive structures including at least the first semiconductor and the second semiconductor by using the method as set forth in the third aspect of producing a semiconductor wafer; and connecting the light-absorptive structures either in series or in parallel.

MODE FOR CARRYING OUT THE INVENTION

Figure 1A:
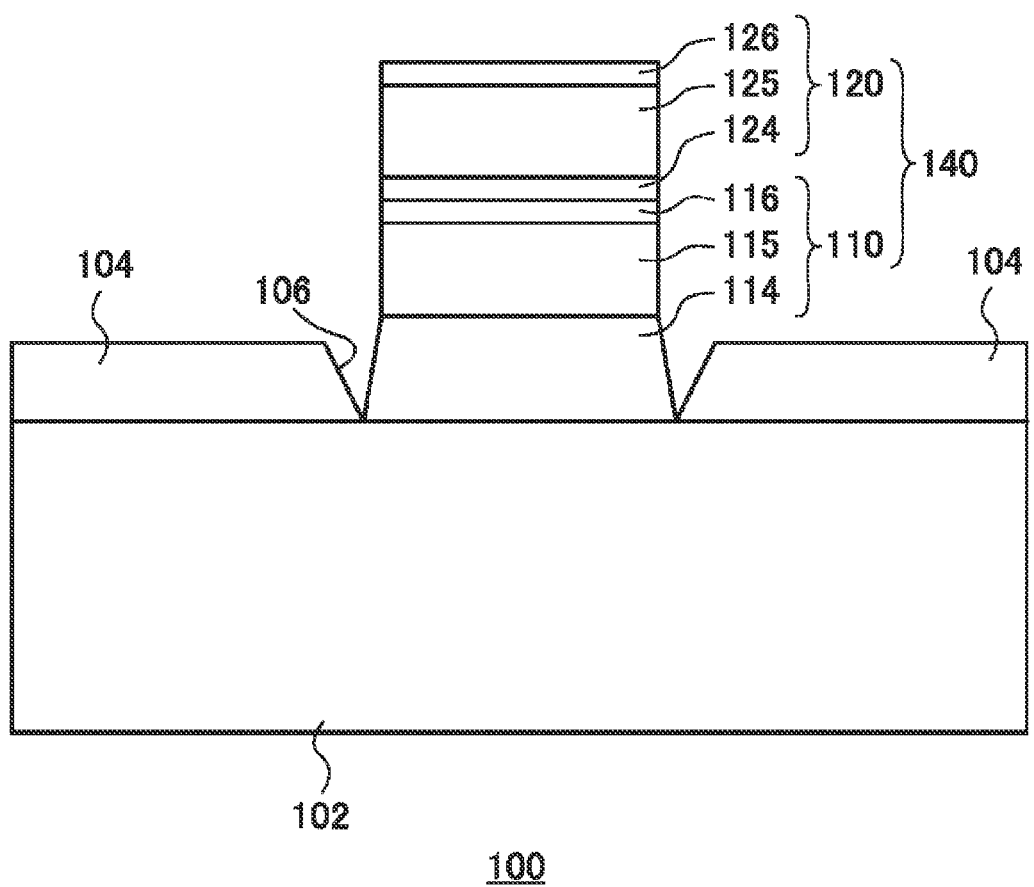
FIG. 1A shows an exemplary cross section of a semiconductor wafer 100.

FIG. 1A shows an exemplary cross section of a semiconductor wafer 100. The semiconductor wafer 100 includes a base wafer 102, an inhibitor 104, and an light-absorptive structure 140. The light-absorptive structure 140 includes a first semiconductor 110 and a second semiconductor 120.

The base wafer 102 is a wafer containing silicon. An example of the wafer containing silicon is a wafer having a surface made of silicon. The base wafer 102 may be a Si wafer or a SOI (silicon-on-insulator) wafer. In an example, the base wafer 102 may be a Si wafer having a B doping amount of $2.0 \times 10^{19} cm^{-3}$.

The inhibitor 104 is formed on the base wafer 102. An aperture 106 is formed on the inhibitor 104, which exposes a surface of the base wafer 102. The inhibitor 104 inhibits crystal growth. For example, when crystals of a semiconductor are grown by an epitaxial growth method, the epitaxial growth of the crystals of the semiconductor is inhibited on the surface of the inhibitor 104. Accordingly, the crystals of the semiconductor can be epitaxially grown selectively inside the aperture 106.

The thickness of the inhibitor 104 is desirably in the range of 0.01 μm to 5 μm inclusive. The aperture 106 is desirably sized to be able to form a semiconductor selectively grown inside the aperture 106 without dislocation. For example, the inhibitor 104 may be a silicon oxide layer, a silicon nitride layer, a silicon oxynitride layer, or the like, or may be made by stacking them. The inhibitor 104 may be made by a thermal oxidation method or CVD, for example.

The first semiconductor 110 includes a first-conductivity-type first semiconductor 114, a low-carrier-concentration first semiconductor 115, and a second-conductivity-type first semiconductor 116. The first-conductivity-type first semiconductor 114 is either a P-type conductivity type or an N-type conductivity type.

The second-conductivity-type first semiconductor 116 is formed directly or indirectly on the first-conductivity-type first semiconductor 114. The second-conductivity-type first semiconductor 116 has a conductivity type different from the first-conductivity-type first semiconductor 114. For example, when the first-conductivity-type first semiconductor 114 has a P-type conductivity type, the second-conductivity-type first semiconductor 116 has an N-type conductivity type.

The low-carrier-concentration first semiconductor 115 is formed between the first-conductivity-type first semiconductor 114 and the second-conductivity-type first semiconductor 116. The effective carrier-concentration of the low-carrier-concentration first semiconductor 115 is lower than the effective carrier-concentration of the first-conductivity-type first semiconductor 114 and the second-conductivity-type first semiconductor 116. For example, the low-carrier-concentration first semiconductor 115 is an intrinsic semiconductor having a composition that is the same as the composition of the first-conductivity-type first semiconductor 114 and the second-conductivity-type first semiconductor 116. The low-carrier-concentration first semiconductor 115 may be a space-charge region formed between the first-conductivity-type first semiconductor 114 and the second-conductivity-type first semiconductor 116.

Here, "space-charge region" is a region formed within a semiconductor by means of the spatial potential (built-in potential) at the interface between a semiconductor and a semiconductor, or at the interface between a semiconductor and a metal. The space-charge region is formed by a PN junction of a semiconductor, a PIN junction, a Schottky junction between a metal and a semiconductor, and a junction between a dielectric and a semiconductor.

The low-carrier-concentration first semiconductor 115 generates electrons and holes, when irradiated with light. The electrons generated in the low-carrier-concentration first semiconductor 115 move to the semiconductor having an N-type conductivity that is either the first-conductivity-type first semiconductor 114 or the second-conductivity-type first semiconductor 116. The holes generated in the low-carrier-concentration first semiconductor 115 move to the semiconductor having a P-type conductivity. As a result, the first semiconductor 110 functions as a photoelectric conversion device generating an electric signal when irradiated with light.

In an example, the first semiconductor 110 is formed to be in contact with a surface of the base wafer 102 exposed inside the aperture 106 of the inhibitor 104, to be positioned either inside the aperture 106, or both inside the aperture 106 and above the inhibitor 104. The semiconductor wafer 100 may include another semiconductor layer between the first semiconductor 110 and the base wafer 102. For example, the semiconductor wafer 100 may include a seed crystal serving as a seed crystal plane suited for crystal growth of the first semiconductor 110, between the first semiconductor 110 and the base wafer 102.

The second semiconductor 120 includes a first-conductive-type second semiconductor 124, a low-carrier-concentration second semiconductor 125, and a second-conductivity-type second semiconductor 126. The first-conductivity-type second semiconductor 124 has either a P-type conductivity or an N-type conductivity. The first-conductivity-type second semiconductor 124 lattice-matches or pseudo lattice-matches the second-conductivity-type first semiconductor 116.

In the present specification, "pseudo lattice-match" is used to describe a phenomenon where the difference in lattice constant between two semiconductors in contact with each other is small although not a complete lattice-match, and so the occurrence of defects due to the lattice mismatch is not noticeable and the two semiconductors can still be stacked. When the semiconductors "pseudo lattice-match," the crystal lattices of the semiconductors deform within the elastically deformable range, thereby absorbing the difference in lattice constant. For example, when Ge and GaAs are stacked, they "pseudo lattice-match."

The second-conductivity-type second semiconductor 126 is formed directly or indirectly on the first-conductivity-type second semiconductor 124. The second-conductivity-type second semiconductor 126 has a conductivity different from the conductivity of the first-conductivity-type second semiconductor 124. For example, when the first-conductivity-type second semiconductor 124 has a P-type conductivity, the second-conductivity-type second semiconductor 126 has an N-type conductivity.

The low-carrier-concentration second semiconductor 125 is formed between the first-conductivity-type second semiconductor 124 and the second-conductivity-type second semiconductor 126. The effective carrier concentration of the low-carrier-concentration second semiconductor 125 is lower than the effective carrier-concentration of the first-conductivity-type second semiconductor 124 and the second-conductivity-type second semiconductor 126. For example, the low-carrier-concentration second semiconductor 125 is an intrinsic semiconductor having a composition that is the same as the composition of the first-conductivity-type second semiconductor 124 and the second-conductivity-type second semiconductor 126. The low-carrier-concentration second semiconductor 125 may be a space-charge region formed between the first-conductivity-type second semiconductor 124 and the second-conductivity-type second semiconductor 126.

The low-carrier-concentration second semiconductor 125 generates electrons and holes, when irradiated with light. The electrons generated in the low-carrier-concentration second semiconductor 125 move to the semiconductor having an N-type conductivity that is either the first-conductivity-type second semiconductor 124 or the second-conductivity-type second semiconductor 126. The holes generated in the low-carrier-concentration second semiconductor 125 move to the semiconductor having a P-type conductivity. As a result, the second semiconductor 120 functions as a photoelectric conversion device generating an electric signal when irradiated with light.

The semiconductor wafer 100 may include another semiconductor layer between the first semiconductor 110 and the second semiconductor 120. For example, the semiconductor wafer 100 may include a semiconductor layer forming a tunnel junction between the first semiconductor 110 and the second semiconductor 120.

The first semiconductor 110 and the second semiconductor 120 are a compound semiconductor, for example. The first semiconductor 110 may be a $C_{x1}Si_{y1}Ge_{z1}Sn_{1-x1-y1-z1}$ crystal ($0 \leq x1 < 1$, $0 \leq y1 \leq 1$, $0 \leq z1 \leq 1$, and $0 < x1+y1+z1 \leq 1$). The first semiconductor 110 may be polycrystal or amorphous $C_{x1}Si_{y1}Ge_{z1}Sn_{1-x1-y1-z1}$ crystal ($0 \leq x1 < 1$, $0 \leq y1 \leq 1$, $0 \leq z1 \leq 1$, and $0 < x1+y1+z1 \leq 1$). For example, the first semiconductor 110 is Ge or SiGe. The first semiconductor 110 may further include a plurality of semiconductor layers constituted by Ge and SiGe having a different composition.

The second semiconductor 120 may be $Al_{x2}In_{y2}Ga_{1-x2-y2}As_{z2}P_{w1}N_{1-z2-w1}$ ($0 \leq x2 \leq 1$, $0 \leq y2 \leq 1$, $0 \leq x2+y2 \leq 1$, $0 \leq z2 \leq 1$, $0 \leq w1 \leq 1$, and $0 \leq z2+w1 > 1$). For example, the second semiconductor 120 is InGaAs. The second semiconductor 120 may include a plurality of semiconductor layers.

For example, the first semiconductor 110 and the second semiconductor 120 are formed by an epitaxial growth method. Some examples of an epitaxial growth method are Chemical Vapor Deposition (occasionally referred to as "CVD"), Metal Organic Chemical Vapor Deposition (occasionally referred to as "MOCVD"), Molecular Beam Epitaxy (occasionally referred to as "MBE"), or Atomic Layer Deposition (occasionally referred to as "ALD").

For example, the inhibitor 104 is formed on the base wafer 102 by a thermal oxidation method, and the aperture 106 is formed through the inhibitor 104 reaching a surface of the base wafer 102 by means of photolithography such as etching. Then, CVD is used to selectively grow the first-conductivity-type first semiconductor 114 and the second-conductivity-type first semiconductor 116 sequentially inside the aperture 106, to form the first semiconductor 110. By selectively growing the first semiconductor 110 within the aperture 106, generation of lattice defect due to difference in lattice constant between the first semiconductor 110 and the base wafer 102 can be restrained. As a result, the crystallinity of the first semiconductor 110 enhances, thereby enhancing the photoelectric conversion efficiency of the first semiconductor 110.

The first semiconductor 110 has been desirably heated after crystal growth. Lattice defects such as dislocation are occasionally formed inside the first semiconductor 110 due to the difference in lattice constant between the base wafer 102 and the first semiconductor 110, for example. The lattice defects move inside the first semiconductor 110 by heating the first semiconductor 110. The defects move inside the first semiconductor 110, to be eventually caught by a gettering sink or the like at the interface or side wall of the first semiconductor 110, or inside the first semiconductor 110. Therefore, by heating the first semiconductor 110, the detects of the first semiconductor 110 are reduced, to improve the crystallinity of the first semiconductor 110.

By controlling the size of the aperture 106 of the inhibitor 104 to a certain size or below, the size of the first semiconductor 110 selectively grown inside the aperture 106 can be restricted. If the size of the aperture 106 is such that the heated lattice defects can move along the surface of the first semiconductor 110, the lattice defects inside the first semiconductor 110 will be removed by heating, to produce a first semiconductor 110 having extremely high crystallinity.

The bottom area of the aperture 106 is preferably 1 mm$^2$ or below, and more preferably in the range of 25 μm$^2$ to 2500 μm$^2$ inclusive, further preferably in the range of 100 μm$^2$ to 1600 μm$^2$ inclusive, or further preferably in the range of 400 μm$^2$ to 900 μm$^2$ inclusive. The bottom area of the aperture 106 smaller than 25 μm$^2$ is not preferable because of being too small to produce a photoelectric device. By enhancing the crystallinity of the first semiconductor 110, the photoelectric conversion efficiency of the first semiconductor 110 is further enhanced.

In an example, the second semiconductor 120 is formed either inside the aperture 106, or both inside the aperture 106 and above the inhibitor 104. The second semiconductor 120 is grown using the first semiconductor 110 as a seed crystal. When the first semiconductor 110 is grown inside the aperture 106, the first semiconductor 110 has a high crystallinity, and therefore the second semiconductor 120 lattice-matching or pseudo lattice-matching the first semiconductor 110 also has a high crystallinity. As a result, the photoelectric conversion efficiency of the second semiconductor 120 can be enhanced.

The first semiconductor 110 is made of a material having a first band gap. The second semiconductor 120 is made of a material having a second band gap larger than the first band gap. The photoelectric device absorbs light having energy corresponding to the band gap and converts it into electric power. The first semiconductor 110 absorbs light having energy corresponding to the first band gap, and subjects it to photoelectric conversion. Since the second semiconductor 120 has the second band gap larger than that of the first semiconductor 110, the second semiconductor 120 absorbs light of a wavelength shorter than the wavelength of light absorbed by the first semiconductor 110, and subjects it to photoelectric conversion. Because the semiconductor wafer 100 has the above-mentioned two-layer tandem structure, the semiconductor wafer 100 can effectively absorb light throughout a wide wavelength range, which allows to enhance the photoelectric conversion efficiency.

Figure 1B:
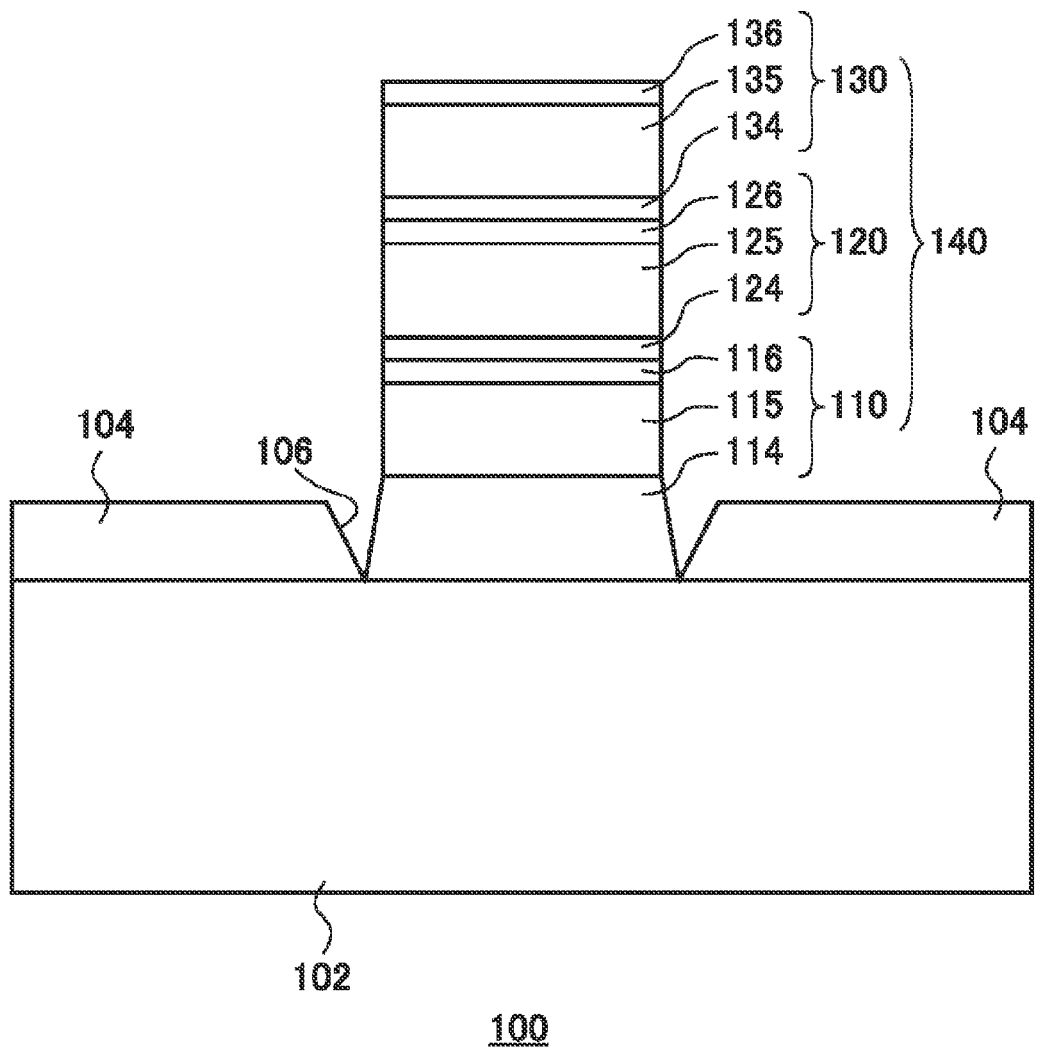
FIG. 1B shows an exemplary cross section of a semiconductor wafer 100.

FIG. 1B shows another exemplary cross section of a semiconductor wafer 100. The semiconductor wafer 100 further includes a third semiconductor 130, compared to the semiconductor wafer 100 shown in FIG. 1A. The third semiconductor 130 lattice-matches or pseudo lattice-matches the second semiconductor 120, and is formed directly or indirectly on the second semiconductor 120.

The third semiconductor 130 includes a first-conductivity-type third semiconductor 134, a low-carrier-concentration third semiconductor 135, and a second-conductivity-type third semiconductor 136. The first-conductivity-type third semiconductor 134 has either a P-type conductivity or an N-type conductivity. The first-conductivity-type third semiconductor 134 lattice-matches or pseudo lattice-matches the second-conductivity-type second semiconductor 126.

The second-conductivity-type third semiconductor 136 is formed directly or indirectly on the first-conductivity-type third semiconductor 134. The second-conductivity-type third semiconductor 136 has a conductivity type different from the conductivity type of the first-conductivity-type third semiconductor 134. The low-carrier-concentration third semiconductor 135 is formed between the first-conductivity-type third semiconductor 134 and the second-conductivity-type third semiconductor 136. The effective carrier-concentration of the low-carrier-concentration third semiconductor 135 is lower than the effective carrier concentration of the first-conductivity-type third semiconductor 134 and the second-conductivity-type third semiconductor 136. For example, the low-carrier-concentration third semiconductor 135 is an intrinsic semiconductor having a composition that is the same as the composition of the first-conductivity-type third semiconductor 134 and the second-conductivity-type third semiconductor 136. The low-carrier-concentration third semiconductor 135 may be a space-charge region formed between the first-conductivity-type third semiconductor 134 and the second-conductivity-type third semiconductor 136.

The third semiconductor may be $Al_{x3}In_{y3}Ga_{1-x3-y3}As_{z3}P_{1-z3}$ ($0 \leq x3 \leq 1$, $0 \leq y3 < 1$, $0 \leq z3 \leq 1$, and $0 \leq x3+y3 \leq 1$). For example, the third semiconductor 130 may include a material having a third band gap larger than the second band gap of the second semiconductor 120.

The first semiconductor 110, the second semiconductor 120, and the third semiconductor 130 are formed inside the aperture 106, for example. Part of the first semiconductor 110, the second semiconductor 120, and the third semiconductor 130 may be formed above the inhibitor 104. Because the semiconductor wafer 100 has a three-layer tandem structure made of the first semiconductor 110, the second semiconductor 120, and the third semiconductor 130, the semiconductor wafer 100 can effectively absorb light throughout a wider wavelength range than that of the semiconductor wafer 100 shown in FIG. 1A, which allows to enhance the photoelectric conversion efficiency.

Figure 2:
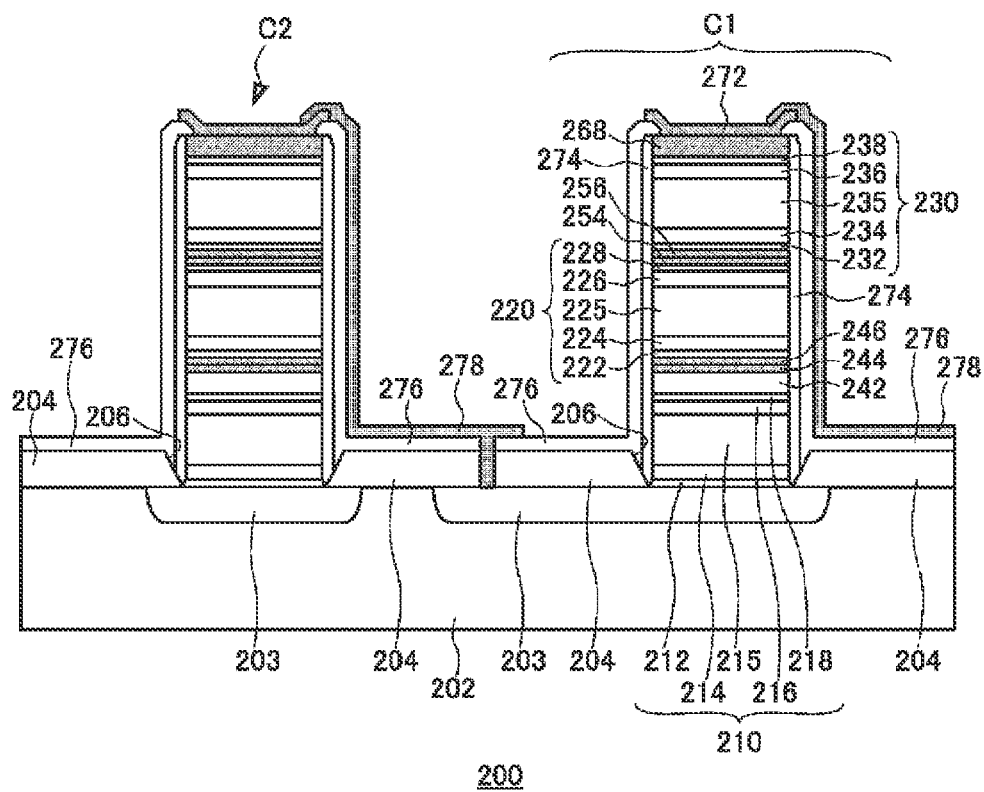
FIG. 2 shows an exemplary cross section of a photoelectric conversion device 200.

FIG. 2 shows an exemplary cross section of a photoelectric conversion device 200, which is another embodiment. The photoelectric conversion device 200 includes a base wafer 202, a well 203, an inhibitor 204, a first semiconductor 210, a second semiconductor 220, a third semiconductor 230, a buffer layer 242, a semiconductor 244, a semiconductor 246, a semiconductor 254, a semiconductor 256, a contact layer 268, a transparent electrode 272, a passivation layer 274, an insulation film 276, and a wire 278.

The inhibitor 204 has a plurality of apertures 206. The photoelectric conversion device 200 includes an light-absorptive structure C1 and an light-absorptive structure C2 formed in the plurality of apertures 206. The photoelectric conversion device 200 may include more light-absorptive structures. In an example, the light-absorptive structure C1 and the light-absorptive structure C2 have the same configuration as each other. The following explanation about the light-absorptive structure C1 also applies to the light-absorptive structure C2.

The base wafer 202 corresponds to the base wafer 102 shown in FIG. 1A, and has the same configuration as that of the base wafer 102. The inhibitor 204 corresponds to the inhibitor 104, and has the same configuration as that of the inhibitor 104.

The first semiconductor 210 includes a BSF (back surface field) 212, a first-conductivity-type first semiconductor 214, a low-carrier-concentration first semiconductor 215, a second-conductivity-type first semiconductor 216, and a window 218. The first semiconductor 210 may be a Group IV compound semiconductor, for example. In an example, the first semiconductor 210 is $C_{x1}Si_{y1}Ge_{z1}Sn_{1-x1-y1-z1}$ ($0 \leq x1 \leq 1$, $0 \leq y1 \leq 1$, $0 \leq z1 \leq 1$, and $0 < x1+y1+z1 \leq 1$). For example, the first semiconductor 210 is Ge, SiGe, or CSiGe. The first semiconductor 210 may have a double heterojunction. The first semiconductor 210 may include a material having the first band gap.

The first-conductivity-type first semiconductor 214 corresponds to the first-conductivity-type first semiconductor 114 shown in FIG. 1A. The second-conductivity-type first semiconductor 216 corresponds to the second-conductivity-type first semiconductor 116. The light-absorptive structure C1 includes the low-carrier-concentration first semiconductor 215 having a lower effective carrier concentration than those of the first-conductivity-type first semiconductor 214 and the second-conductivity-type first semiconductor 216, between the first-conductivity-type first semiconductor 214 and the second-conductivity-type first semiconductor 216.

The first-conductivity-type first semiconductor 214 may be P-type Ge having a thickness in the range of 0.5 µm to 50.0 µm inclusive. An example of such a first-conductivity-type first semiconductor 214 is P-type Ge of 2.0 µm. The low-carrier-concentration first semiconductor 215 may be P-type Ge having a thickness in the range of 0.3 µm to 3.0 µm inclusive, and a carrier concentration in the range of $1.0 \times 10^{16}$ cm$^{-3}$ to $1.0 \times 10^{18}$ cm$^{-3}$ inclusive, or P-type Ge having a B doping amount in the range of $1.0 \times 10^{16}$ cm$^{-3}$ to $1.0 \times 10^{18}$ cm$^{-3}$ inclusive. An example of such a low-carrier-concentration first semiconductor 215 is P-type Ge of 1.0 µm.

The second-conductivity-type first semiconductor 216 may be N-type Ge having a thickness in the range of 0.02 µm to 5.0 µm inclusive, with a P (phosphorus) doping amount in the range of $1 \times 10^{18}$ cm$^{-3}$ to $5 \times 10^{20}$ cm$^{-3}$ inclusive. An example of such a second-conductivity-type first semiconductor 216 is N-type Ge having a thickness of 0.05 µm with a P (phosphorus) doping amount of $2.0 \times 10^{18}$ cm$^{-3}$. The first semiconductor 210 including the above-explained first-conductivity-type first semiconductor 214 and second-conductivity-type first semiconductor 216 includes a first band gap of 0.66 eV for example.

The BSF 212 is an example of a recombination repressor repressing recombination of charge. Here, BSF is an abbreviated form of "back surface field." Here, the concept of "recombination" is that the excited electron and the excited hole are recombined to be extinguished. The BSF 212 may have a band gap larger than the band gaps of the first-conductivity-type first semiconductor 214 and the second-conductivity-type first semiconductor 216. The BSF 212 is formed directly or indirectly on the base wafer 202.

The BSF 212 is a semiconductor lattice-matching or pseudo lattice-matching the base wafer 202. The BSF 212 may be P-type SiGe having a thickness in the range of 0.01 μm to 0.5 μm inclusive, with a Ga doping amount in the range of $5 \times 10^{18}$ cm$^{-3}$ to $5 \times 10^{20}$ cm$^{-3}$ inclusive. An example of such a BSF 212 is P-type $Si_{0.1}Ge_{0.9}$ having a thickness of 0.02 μm with a Ga doping amount of $2.0 \times 10^{19}$ cm$^{-3}$.

The window 218 is an exemplary recombination repressor repressing recombination of charge. The window 218 may have a band gap larger than the band gaps of the first-conductivity-type first semiconductor 214 and the second-conductivity-type first semiconductor 216. The window 218 is formed on the second-conductivity-type first semiconductor 216. The window 218 is a semiconductor lattice-matching or pseudo lattice-matching the second-conductivity-type first semiconductor 216. The window 218 may be N-type GaInP having a thickness in the range of 0.01 μm to 0.3 μm inclusive with a Si doping amount in the range of $1 \times 10^{18}$ cm$^{-3}$ to $4 \times 10^{19}$ cm$^{-3}$ inclusive. An example of such a window 218 is N-type $Ga_{0.5}In_{0.5}P$ having a thickness of 0.02 μm and a Si doping amount of $5.0 \times 10^{18}$ cm$^{-3}$.

Each semiconductor layer of the first semiconductor 210 is formed by an epitaxial growth method, for example. Some examples of an epitaxial growth method are CVD, MOCVD, MBE, and ALD. For example, an inhibitor 204 is formed on the base wafer 202 using the above-explained method, the inhibitor 204 having a plurality of apertures 206 formed therethrough which expose a surface of the base wafer 202. Then the first semiconductor 210 can be formed by selectively growing, inside the aperture 206, the BSF 212, the first-conductivity-type first semiconductor 214, the low-carrier-concentration first semiconductor 215, the second-conductivity-type first semiconductor 216, and the window 218 sequentially, by using the MOCVD method.

The first semiconductor 210 is formed to be in contact with a surface of the base wafer 202 exposed inside the aperture 206 of the inhibitor 204, to be positioned inside the apertures 206, for example. Part of the first semiconductor 210 may be formed above the inhibitor 204, protruding from the apertures 206.

The buffer layer 242 is formed directly or indirectly on the window 218, for example. The buffer layer 242 is a semiconductor lattice-matching or pseudo lattice-matching the window 218, for example. The buffer layer 242 may be a semiconductor layer that can alleviate the mutual adverse effect incurred between the semiconductor layers positioned thereabove and thereunder. The buffer layer 242 is formed by an epitaxial growth method, for example. Some examples of an epitaxial growth method are CVD, MOCVD, MBE, and ALD.

The buffer layer 242 may be N-type GaAs having a thickness in the range of 0.01 μm to 0.5 μm inclusive, with a Si doping amount in the range of $2.0 \times 10^{18}$ cm$^{-3}$ to $2.0 \times 10^{19}$ cm$^{-3}$. An example of such a buffer layer 242 is N-type GaAs having a thickness of 0.1 μm with a Si doping amount of $3.0 \times 10^{18}$ cm$^{-3}$.

The semiconductor 244 and the semiconductor 246 are a P-type semiconductor doped with P-type impurities in high concentration, or an N-type semiconductor doped with N-type impurities in high concentration. The semiconductor 244 and the semiconductor 246 respectively have different conductivity types. The semiconductor 244 and the semiconductor 246 may form a tunnel junction.

For example, when the semiconductor 244 is an N-type semiconductor doped with N-type impurities in high concentration, and the semiconductor 246 is a P-type semiconductor doped with P-type impurities in high concentration, a tunnel junction is formed at the interface between the semiconductor 244 and the semiconductor 246. When the light-absorptive structure C1 has such a tunnel junction, the electrons or the holes generated by photoelectric conversion between the first semiconductor 210 and the second semiconductor 220 smoothly flow between the first semiconductor 210 and the second semiconductor 220. As a result, the light-absorptive structure C1 can efficiently output current.

The semiconductor 244 may be N-type GaAs having a thickness in the range of 0.01 μm to 0.2 μm inclusive, with a Si doping amount in the range of $3.0 \times 10^{18}$ cm$^{-3}$ to $2.0 \times 10^{19}$ cm$^{-3}$ inclusive. An example of such a semiconductor 244 is N-type GaAs having a thickness of 0.015 μm with a Si doping amount of $1.0 \times 10^{19}$ cm$^{-3}$. The semiconductor 246 may be P-type GaAs having a thickness in the range of 0.01 μm to 0.2 μm inclusive, with a C doping amount in the range of $2.0 \times 10^{19}$ cm$^{-3}$ to $1.0 \times 10^{21}$ cm$^{-3}$ inclusive. An example of such a semiconductor 246 is P-type GaAs having a thickness of 0.015 μm with a C doping amount of $1.0 \times 10^{20}$ cm$^{-3}$.

The semiconductor 244 and the semiconductor 246 are formed directly or indirectly on the buffer layer 242. The semiconductor 244 and the semiconductor 246 are a semiconductor lattice-matching or pseudo lattice-matching the buffer layer 242. The semiconductor 244 and the semiconductor 246 may be formed by an epitaxial growth method. Some examples of an epitaxial growth method are CVD, MOCVD, MBE, and ALD. For example, the MOCVD may be used to selectively grow, directly or indirectly on the buffer layer 242, the semiconductor 244 and the semiconductor 246 sequentially.

The second semiconductor 220 includes a BSF 222, a first-conductivity-type second semiconductor 224, a second-conductivity-type second semiconductor 226, and a window 228. The second semiconductor 220 may be a compound semiconductor. The second semiconductor 220 may be $Al_{x2}In_{y2}Ga_{1-x2-y2}As_{z2}P_{w1}N_{1-z2-w1}$ ($0 \leq x2 \leq 1$, $0 \leq y2 \leq 1$, $0 \leq x2+y2 \leq 1$, $0 \leq z2 \leq 1$, $0 \leq w1 \leq 1$, and $0 \leq z2+w1 \leq 1$). For example, the second semiconductor 220 is InGaAs. The second semiconductor 220 may include a double heterojunction. The second semiconductor 220 may include a material having a second band gap larger than the first band gap included in the first semiconductor 210.

The first-conductivity-type second semiconductor 224 corresponds to the first-conductivity-type second semiconductor 124 shown in FIG. 1A. The second-conductivity-type second semiconductor 226 corresponds to the second-conductivity-type second semiconductor 126. The light-absorptive structure C1 includes a low-carrier-concentration second semiconductor 225 having a lower effective carrier concentration than those of the first-conductivity-type second semiconductor 224 and the second-conductivity-type second semiconductor 226, between the first-conductivity-type second semiconductor 224 and the second-conductivity-type second semiconductor 226.

The first-conductivity-type second semiconductor 224 may be P-type InGaAs having a thickness in the range of 0.3 μm to 3.0 μm inclusive, with a Zn doping amount in the range of $1.0 \times 10^{17}$ cm$^{-3}$ to $1.0 \times 10^{20}$ cm$^{-3}$ inclusive. An example of such a first-conductivity-type second semiconductor 224 is P-type $In_{0.01}Ga_{0.99}As$ having a thickness of 0.05 μm with a Zn doping amount of $1.0 \times 10^{19}$ cm$^{-3}$. The low-carrier-concentration second semiconductor 225 may be P-type InGaAs having a thickness in the range of 0.3 μm to 3.0 μm inclusive with a carrier concentration in the range of $1.0 \times 10^{16}$ cm$^{-3}$ to $1.0 \times 10^{18}$ cm$^{-3}$ inclusive, or P-type InGaAs having a Zn doping amount in the range of $1.0 \times 10^{16}$ cm$^{-3}$ to $1.0 \times 10^{18}$ cm$^{-3}$ inclusive. An example of such a low-carrier-concentration second semiconductor 225 is P-type In$_{0.01}$Ga$_{0.99}$As having a carrier concentration of $1.0 \times 10^{17}$ cm$^{-3}$ and a Zn doping amount of $1.0 \times 10^{17}$ cm$^{-3}$.

The second-conductivity-type second semiconductor 226 may be N-type InGaAs having a thickness in the range of 0.01 μm to 1 μm inclusive, with a Si doping amount in the range of $5.0 \times 10^{17}$ cm$^{-3}$ to $6.0 \times 10^{18}$ cm$^{-3}$ inclusive. An example of such a second-conductivity-type second semiconductor 226 is an N-type In$_{0.01}$Ga$_{0.99}$As having a thickness of 0.05 μm and a Si doping amount of $2.0 \times 10^{18}$ cm$^{-3}$. The second semiconductor 220 including the first-conductivity-type second semiconductor 224 and the second-conductivity-type second semiconductor 226 includes a second band gap of 1.39 eV, for example.

The BSF 222 is an example of a recombination repressor repressing recombination of charge. The BSF 222 may have a band gap larger than the band gaps of the first-conductivity-type second semiconductor 224 and the second-conductivity-type second semiconductor 226. The BSF 222 may be formed directly or indirectly on the semiconductor 246. The BSF 222 is a semiconductor lattice-matching or pseudo lattice-matching the semiconductor 246. The BSF 222 may be P-type GaInP having a thickness in the range of 0.01 μm to 1 μm inclusive, with a Zn doping amount in the range of $1.0 \times 10^{18}$ cm$^{-3}$ to $5.0 \times 10^{19}$ cm$^{-3}$ inclusive. An example of such a BSF 222 is P-type Ga$_{0.5}$In$_{0.5}$P having a thickness of 0.02 μm with a Zn doping amount of $2.0 \times 10^{19}$ cm$^{-3}$.

The window 228 is an exemplary recombination repressor repressing recombination of charge. The window 228 may have a band gap larger than the band gaps of the first-conductivity-type second semiconductor 224 and the second-conductivity-type second semiconductor 226. The window 228 is formed directly or indirectly on the second-conductivity-type second semiconductor 226, for example. The window 228 is a semiconductor lattice-matching or pseudo lattice-matching the second-conductivity-type second semiconductor 226. The window 228 may be N-type GaInP having a thickness in the range of 0.01 μm to 1 μm inclusive, with a Si doping amount in the range of $1.0 \times 10^{18}$ cm$^{-3}$ to $1.0 \times 10^{19}$ cm$^{-3}$ inclusive. An example of such a window 228 is N-type Ga$_{0.5}$In$_{0.5}$P having a thickness of 0.02 μm and a Si doping amount of $5.0 \times 10^{18}$ cm$^{-3}$.

Each semiconductor layer of the second semiconductor 220 is formed by an epitaxial growth method, for example. Some examples of an epitaxial growth method are CVD, MOCVD, MBE, and ALD. The second semiconductor 220 can be formed by selectively growing, on the semiconductor 246, the BSF 222, the first-conductivity-type second semiconductor 224, the low-carrier-concentration second semiconductor 225, the second-conductivity-type second semiconductor 226, and the window 228 sequentially, by using the MOCVD method. The second semiconductor 220 may be formed inside the apertures 206 of the inhibitor 204, with part of the second semiconductor 220 formed above the inhibitor 204 protruding from the apertures 206.

The semiconductor 254 and the semiconductor 256 are a P-type semiconductor doped with P-type impurities in high concentration, or an N-type semiconductor doped with N-type impurities in high concentration. The semiconductor 254 and the semiconductor 256 respectively have different conductivity types. The semiconductor 254 and the semiconductor 256 may form a tunnel junction. For example, when the semiconductor 254 is an N-type semiconductor doped with N-type impurities in high concentration, and the semiconductor 256 is a P-type semiconductor doped with P-type impurities in high concentration, a tunnel junction is formed at the interface between the semiconductor 254 and the semiconductor 256. When the light-absorptive structure C1 has such a tunnel junction, the electrons or the holes generated by photoelectric conversion between the second semiconductor 220 and the third semiconductor 230 smoothly flow between the second semiconductor 220 and the third semiconductor 230. As a result, the light-absorptive structure C1 can efficiently output current.

The semiconductor 254 may be N-type GaAs having a thickness in the range of 0.01 μm to 0.2 μm inclusive, with a Si doping amount in the range of $3.0 \times 10^{18}$ cm$^{-3}$ to $2.0 \times 10^{19}$ cm$^{-3}$ inclusive. An example of such a semiconductor 254 is N-type GaAs having a thickness of 0.015 μm and a Si doping amount of $1.0 \times 10^{19}$ cm$^{-3}$. The semiconductor 256 may be P-type GaAs having a thickness in the range of 0.01 μm to 0.2 μm inclusive, with a C doping amount in the range of $2.0 \times 10^{19}$ cm$^{-3}$ to $1.0 \times 10^{21}$ cm$^{-3}$ inclusive. An example of such a semiconductor 256 is P-type GaAs having a thickness of 0.015 μm and a C doping amount of $1.0 \times 10^{20}$ cm$^{-3}$.

The semiconductor 254 and the semiconductor 256 may be formed directly or indirectly on the window 228. The semiconductor 254 and the semiconductor 256 are a semiconductor lattice-matching or pseudo lattice-matching the window 228. The semiconductor 254 and the semiconductor 256 may be formed by an epitaxial growth method. Some examples of an epitaxial growth method are CVD, MOCVD, MBE, and ALD. For example, the MOCVD may be used to selectively grow, directly or indirectly on the window 228, the semiconductor 254 and the semiconductor 256 sequentially.

The third semiconductor 230 includes a BSF 232, a first-conductivity-type third semiconductor 234, a low-carrier-concentration third semiconductor 235, a second-conductivity-type third semiconductor 236, and a window 238. The third semiconductor 230 may be a compound semiconductor. The third semiconductor 230 may be Al$_{x3}$In$_{y3}$Ga$_{1-x3-y3}$As$_{z3}$P$_{1-z3}$ ($0 \leq x3 \leq 1$, $0 \leq y3 \leq 1$, $0 \leq z3 \leq 1$, and $0 \leq x3+y3 \leq 1$). For example, the third semiconductor 230 is GaInP. The third semiconductor 230 may include a third space-charge region. The third semiconductor 230 may include a double heterojunction. The third semiconductor 230 may include a material having a third band gap larger than the second band gap explained above.

The BSF 232 is an example of a recombination repressor repressing recombination of charge. The BSF 232 may have a band gap larger than the band gaps of the first-conductivity-type third semiconductor 234 and the second-conductivity-type third semiconductor 236. The BSF 232 is formed on the semiconductor 256. The BSF 232 is a semiconductor lattice-matching or pseudo lattice-matching the semiconductor 256. The BSF 232 may be P-type AlGaInP having a thickness in the range of 0.01 μm to 1 μm inclusive and a Zn doping amount in the range of $1.0 \times 10^{18}$ cm$^{-3}$ to $5.0 \times 10^{19}$ cm$^{-3}$ inclusive. An example of such a BSF 232 is P-type Al$_{0.1}$Ga$_{0.4}$In$_{0.5}$P having a thickness of 0.02 μm with a Zn doping amount of $2.0 \times 10^{19}$ cm$^{-3}$.

The first-conductivity-type third semiconductor 234 has a P-type conductivity type or an N-type conductivity type. The second-conductivity-type third semiconductor 236 has a conductivity type different from the conductivity type of the first-conductivity-type third semiconductor 234. For example, when the first-conductivity-type third semiconductor 234 is a P-type semiconductor and the second-conductivity-type third semiconductor 236 is an N-type semiconductor, a space-charge region is formed in the low-carrier-concentration third semiconductor 235 between the first-conductivity-type third semiconductor 234 and the second-conductivity-type third semiconductor 236. The third semiconductor 230 generates electrons and holes, when the space-charge region is irradiated with light. The electrons generated in the third semiconductor 230 move to the N-type semiconductor that is either the first-conductivity-type third semiconductor 234 or the second-conductivity-type third semiconductor 236, and the holes move to the P-type semiconductor. As a result, the third semiconductor 230 functions as a photoelectric conversion device.

The first-conductivity-type third semiconductor 234 may be P-type GaInP having a thickness in the range of 0.3 μm to 3.0 μm inclusive and a Zn doping amount in the range of $1.0 \times 10^{17}$ $cm^{-3}$ to $1.0 \times 10^{20}$ $cm^{-3}$ inclusive. An example of such a first-conductivity-type third semiconductor 234 is P-type $Ga_{0.5}In_{0.5}P$ having a thickness of 0.05 μm and a Zn doping amount of $1.0 \times 10^{19}$ $cm^{-3}$. The low-carrier-concentration third semiconductor 235 may be a P-type GaInP having a thickness in the range of 0.3 μm to 3.0 μm inclusive and a carrier concentration in the range of $1.0 \times 10^{16}$ $cm^{-3}$ to $1.0 \times 10^{18}$ $cm^{-3}$ inclusive, or P-type GaInP having a Zn doping amount in the range of $1.0 \times 10^{16}$ $cm^{-3}$ to $1.0 \times 10^{18}$ $cm^{-3}$ inclusive. An example of such a low-carrier-concentration third semiconductor 235 is P-type $Ga_{0.5}In_{0.5}P$ having a thickness of 1.0 μm, a carrier concentration of $1.0 \times 10^{17}$ $cm^{-3}$, and a Zn doping amount of $1.0 \times 10^{17}$ $cm^{-3}$.

The second-conductivity-type third semiconductor 236 may be N-type GaInP having a thickness in the range of 0.01 μm to 1 μm inclusive and a Si doping amount in the range of $5.0 \times 10^{17}$ $cm^{-3}$ to $6.0 \times 10^{18}$ $cm^{-3}$ inclusive. An example of such a second-conductivity-type third semiconductor 236 is an N-type $Ga_{0.5}In_{0.5}P$ having a thickness of 0.05 μm and a Si doping amount of $2.0 \times 10^{18}$ $cm^{-3}$. The third semiconductor 230 includes a third band gap of 1.80 eV, for example.

The window 238 is an exemplary recombination repressor repressing recombination of charge. The window 238 has a band gap larger than the band gaps of the first-conductivity-type third semiconductor 234 and the second-conductivity-type third semiconductor 236. The window 238 is formed directly or indirectly on the second-conductivity-type third semiconductor 236. The window 238 is a semiconductor lattice-matching or pseudo lattice-matching the second-conductivity-type third semiconductor 236. The window 238 may be N-type AlGaInP having a thickness in the range of 0.01 μm to 1 μm inclusive and a Si doping amount in the range of $1.0 \times 10^{18}$ $cm^{-3}$ to $1.0 \times 10^{19}$ $cm^{-3}$ inclusive. An example of such a window 238 is N-type $Al_{0.1}Ga_{0.4}In_{0.5}P$ having a thickness of 0.02 μm and a Si doping amount of $5.0 \times 10^{18}$ $cm^{-3}$.

Each semiconductor layer of the third semiconductor 230 is formed by an epitaxial growth method, for example. Some examples of an epitaxial growth method are CVD, MOCVD, MBE, and ALD. The third semiconductor 230 can be formed by selectively growing, on the semiconductor 256, the BSF 232, the first-conductivity-type third semiconductor 234, the low-carrier-concentration third semiconductor 235, the second-conductivity-type third semiconductor 236, and the window 238 sequentially, by using the MOCVD method. The third semiconductor 230 is formed inside the apertures 206 of the inhibitor 204. Part of the third semiconductor 230 may be formed above the inhibitor 204, protruding from the apertures 206.

The contact layer 268 is a semiconductor provided to assure electric conductivity between the transparent electrode 272 formed thereabove and the third semiconductor 230. The contact layer 268 may have the same conductivity as the window 238. The contact layer 268 is formed on the window 238. The contact layer 268 is a semiconductor lattice-matching or pseudo lattice-matching the window 238. The contact layer 268 may be N-type GaAs having a thickness in the range of 0.01 μm to 0.05 μm inclusive and a Si doping amount in the range of $3.0 \times 10^{18}$ $cm^{-3}$ to $2.0 \times 10^{19}$ $cm^{-3}$ inclusive. An example of such a contact layer 268 is N-type GaAs having a thickness of 0.10 μm and a Si doping amount of $6.0 \times 10^{18}$ $cm^{-3}$. Or, the contact layer 268 may be N-type GaAs having a thickness of 0.10 μm and a Te doping amount of $2.0 \times 10^{19}$ $cm^{-3}$.

The contact layer 268 is formed by an epitaxial growth method, for example. Some examples of an epitaxial growth method are CVD, MOCVD, MBE, and ALD. For example, the MOCVD may be used to selectively grow the contact layer 268 on the window 238.

The passivation layer 274 is formed on the side wall of the light-absorptive structure C1, and represses recombination of charge on the side wall. An exemplary material of the passivation layer 274 is InGaP. Some examples of the method of forming the passivation layer 274 are CVD, MOCVD, MBE, and ALD.

The insulation film 276 electrically isolates each light-absorptive structure. Some examples of the insulation film 276 are $Al_2O_3$, $SiO_2$, $Si_3N_4$, and $ZrO_2$. The insulation film 276 may be formed using plasma CVD, ion plating, sputtering, CVD, MOCVD, or the like.

The transparent electrode 272 is formed to be in contact with the contact layer 268, for example. The transparent electrode 272 outputs electric power from the light-absorptive structure C1 to outside. The transparent electrode 272 has a material having conductivity and not preventing the light from being incident on the light-absorptive structure C1. Some examples of the material of the transparent electrode 272 are ITO (indium tin oxide), ZnO, and $TiO_2$. For example, the transparent electrode 272 may be formed by sputtering, or the like.

The well 203 is formed in the silicon contained in the base wafer 202, and is electrically coupled to the first semiconductor of the light-absorptive structure C1. The wells 203 are electrically isolated from the silicon bulk region. For example, when the wells 203 have a conductivity type different from the conductivity type of the silicon, a PN junction is formed between the wells 203 and the silicon, to electrically isolate the wells 203 from the silicon. The electric power generated by the light-absorptive structure C1 can be taken out as electromotive force between the wells 203 and the transparent electrode 272.

The wells 203 are formed by ion implantation or a thermal diffusion method. For example, the wells 203 may be formed by forming, on the base wafer 202, a mask having apertures at positions at which the wells 203 are to be formed, by means of photolithography such as etching, and performing ion implantation. For example, P-type wells 203 may be formed by implanting or diffusing B to an N-type Si base wafer 202.

The wire 278 is connected to the transparent electrode 272, and outputs electric power taken out from the light-absorptive structure C1 via the transparent electrode 272 to an external circuit. In the present embodiment, the wire 278 connects the transparent electrode 272 of the light-absorptive structure C2 to the well 203 of the light-absorptive structure C1, to serially connect these two light-absorptive structures. Some examples of the material of the wire 278 are Cu, Ag, and Al. The wire 278 may be formed by CVD, vacuum evaporation, sputtering, or the like.

The photoelectric conversion device 200 has a three-layer tandem structure including the first semiconductor 210, the second semiconductor 220, and the third semiconductor 230. Because of having such a three-layer tandem structure, the photoelectric conversion device 200 can effectively absorb light throughout a wide wavelength range, which allows to enhance the photoelectric conversion efficiency.

FIG. 3 through FIG. 7 respectively show an exemplary cross section of the photoelectric conversion device 200 in its production process. As follows, the method of producing the photoelectric conversion device 200 is explained with reference to these drawings. The method of producing the photoelectric conversion device 200 includes: forming a well, forming an inhibitor, forming a first semiconductor, heating the first semiconductor, forming a second semiconductor, forming a third semiconductor, conducting passivation processing, and connecting an light-absorptive structures either in series or in parallel.

In forming a well, a well 203 is formed in the base wafer 202. For example, when a P-type well 203 is formed in the base wafer 202 that is an N-type silicon wafer, the well 203 is formed by forming, on the base wafer 202, a mask having apertures at positions at which the wells 203 are to be formed, by means of photolithography such as etching, and implanting B ion, for example.

Figure 3:
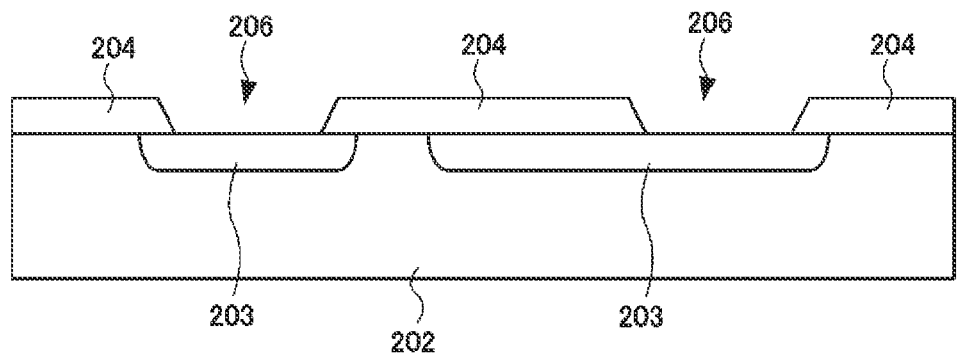
FIG. 3 shows an exemplary cross section of the photoelectric conversion device 200 in its production process.

In forming an inhibitor, an inhibitor 204 having apertures 206 to expose a surface of the base wafer 202 is formed on the base wafer 202, as shown in FIG. 3. In the method of forming the inhibitor 204, a thermal oxidation method may be used to form an silicon oxide film on the entire surface of the base wafer 202, for example. Then on the silicon oxide film, the plurality of apertures 206 are formed to expose the surface of the base wafer 202 by means of photolithography such as etching, to complete the inhibitor 204.

Figure 4:
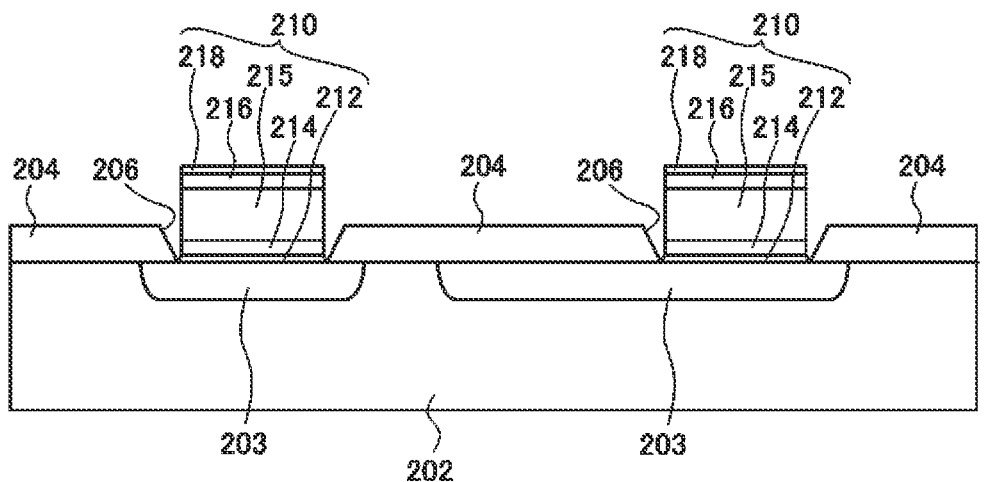
FIG. 4 shows an exemplary cross section of the photoelectric conversion device 200 in its production process.

In forming a first semiconductor, the first semiconductor 210 is formed inside the apertures 206 by means of the selective epitaxial growth method, as shown in FIG. 4. For example, the MOCVD is used to form the first semiconductor 210 including the BSF 212 that is P-type SiGe, the first-conductivity-type first semiconductor 214 that is P-type Ge, the low-carrier-concentration first semiconductor 215, the second-conductivity-type first semiconductor 216 that is N-type Ge, and the window 218 that is N-type GaInP, by an epitaxial growth method.

Specifically, the Si base wafer 202 on which an inhibitor 204 having apertures 206 has been formed is mounted on the heating platform of the reduced pressure barrel-type MOCVD chamber. Next, substitution of highly pure hydrogen is sufficiently performed in the chamber, and then the base wafer 202 is started to be heated. The wafer temperature at the time of crystal growth is in the range of 500 degrees centigrade to 800 degrees centigrade. When the temperature of the base wafer 202 is stabilized at an adequate level, a Si source is introduced into the chamber, followed by introduction of a Ge source, to form the BSF 212 that is P-type SiGe by an epitaxial growth method.

Some examples of Si source are chlorosilane, dichlorosilane, trichlorosilane, tetrachlorosilane, silane, or disilane. Some examples of Ge source are germane and tetramethyl germanium ($(CH_3)_4Ge$). It is also possible to use Ga as an acceptor impurity, and trimethylgallium (TMG) as a P-type dopant. Other examples of the acceptor impurity are B and Al. Trimethylboron (TMB) and trimethylaluminum (TMA) may also be used as a dopant.

It is possible to sequentially form, on the BSF 212, the first-conductivity-type first semiconductor 214 that is P-type Ge, the second-conductivity-type first semiconductor 216 that is N-type Ge, and the window 218 that is N-type GaInP, by an epitaxial growth method. An example of In source is trimethylindium (TMI). An example of P source is phosphine ($PH_3$). It is possible to use P as a donor impurity, and phosphine as an N-type dopant. Another example of the donor impurity is As. Arsine ($AsH_3$) may be used as a dopant.

An example of the epitaxial growth condition is the pressure in the reaction chamber of 0.1 atm, the growth temperature of 650 degrees centigrade, and the growth rate of 1-3 μm/hr. Highly pure hydrogen may be used as a carrier gas of the source. Each semiconductor explained later may also be epitaxially grown in the same MOCVD, with adequate adjustment of parameters such as source gas, pressure in the chamber, growth temperature, and growth duration.

In heating the first semiconductor 210, by heating the first semiconductor 210, the lattice defects such as dislocation attributed to the difference in lattice constant between the base wafer 202 and the first semiconductor 210 are reduced in the first semiconductor 210, to improve the crystallinity of the first semiconductor 210. The first semiconductor 210 may be heated in a plurality of phases. For example, after performing high-temperature annealing at a temperature not reaching the melting point of the first semiconductor 210, a low-temperature annealing is conducted at a temperature lower than the temperature used in the high-temperature annealing. Such a two-phase annealing may be repeated several times.

After forming each layer of the first semiconductor 210, the first semiconductor 210 is heated. The heating of the first semiconductor 210 may be performed after forming part of the first semiconductor. For example, the first semiconductor 210 may be heated after formation of only the BSF 212 that is P-type SiGe. In this case, the temperature and duration for the high-temperature annealing is in the range of 850 to 900 degrees centigrade for two to 10 minutes, and the temperature and duration for the low-temperature annealing is in the range of 650 to 780 degrees centigrade for two to 10 minutes, for example. This two-phase annealing may be repeated ten times, for example.

Figure 5:
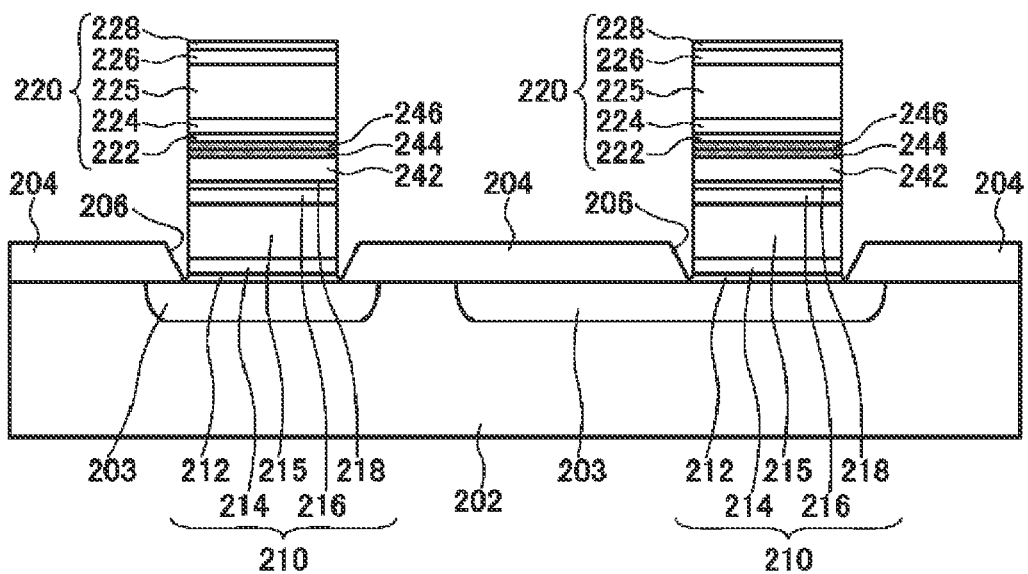
FIG. 5 shows an exemplary cross section of the photoelectric conversion device 200 in its production process.

In forming the second semiconductor 220, the buffer layer 242, the semiconductor 244, the semiconductor 246, and the second semiconductor 220 are sequentially formed by an epitaxial growth method as shown in FIG. 5. First, MOCVD is used to epitaxially grow the crystal of the buffer layer 242 that is N-type GaAs, to be in contact with the window 218. Thereafter, directly or indirectly on the buffer layer 242, the semiconductor 244 that is N-type GaAs, the semiconductor 246 that is P-type GaAs, the BSF 222 that is P-type GaInP, the first-conductivity-type second semiconductor 224 that is P-type InGaAs, the low-carrier-concentration second semiconductor 225, the second-conductivity-type second semiconductor 226 that is N-type InGaAs, and the window 228 that is N-type GaInP may be sequentially formed by an epitaxial growth method.

Arsine ($AsH_3$) may be used as an As source. Further examples of the acceptor impurity are C and Zn. Further examples of the donor impurity are Si, Se, Ge, Sn, Te, and S.

Figure 6:
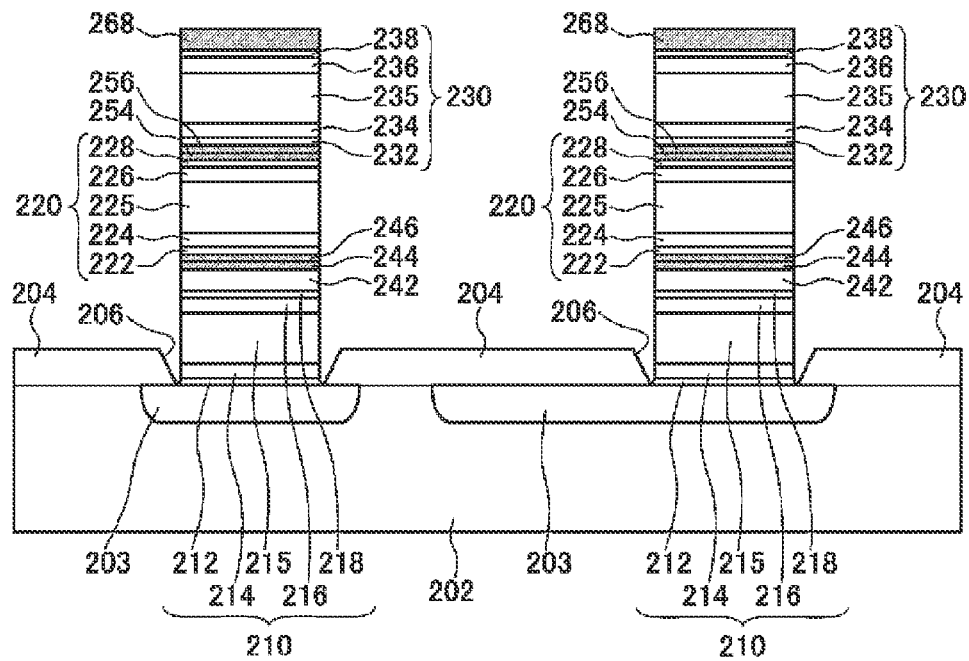
FIG. 6 shows an exemplary cross section of the photoelectric conversion device 200 in its production process.

In forming the third semiconductor, the semiconductor 254, the semiconductor 256, the third semiconductor, and the contact layer 268 are sequentially formed by an epitaxial growth method, as shown in FIG. 6. First, MOCVD is used to epitaxially grow the semiconductor 254 that is N-type GaAs, to be in contact with the window 228. Thereafter, on the semiconductor 254, the semiconductor 256 that is P-type GaAs, the BSF 232 that is P-type AlGaInP, the first-conductivity-type third semiconductor 234 that is P-type GaInP, the low-carrier-concentration third semiconductor 235, the second-conductivity-type third semiconductor 236 that is N-type GaInP, the window 238 that is N-type AlGaInP, and the contact layer 268 that is N-type GaAs are sequentially formed by an epitaxial growth method.

Figure 7:
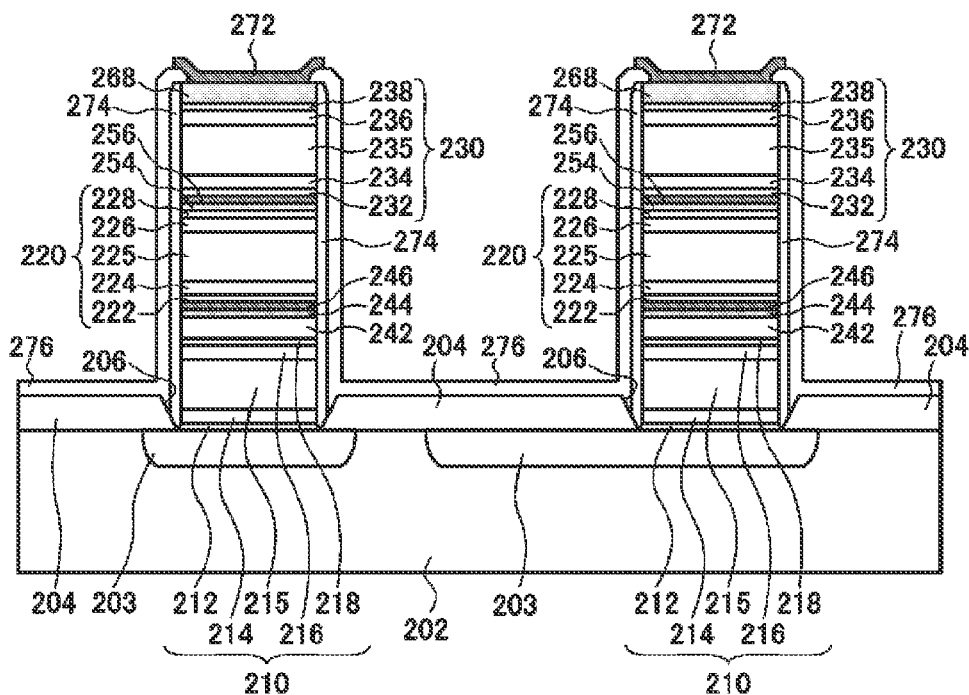
FIG. 7 shows an exemplary cross section of the photoelectric conversion device 200 in its production process.

In conducting passivation processing, after the passivation layer 274 and the insulation film 276 are formed on the side walls of the light-absorptive structure C1 and the light-absorptive structure C2, the transparent electrode 272 is formed, as shown in FIG. 7. For example, the MOCVD is used to epitaxially grow the passivation layer 274 that is InGaP, on the side surfaces of the light-absorptive structure C1 and the light-absorptive structure C2. For example, the insulation film 276 can be obtained by forming a $ZrO_2$ film by sputtering.

Next, by means of photolithography such as etching, the insulation film 276 is partially removed at a position at which a transparent electrode is to be formed to form an aperture, thereby exposing the contact layer 268. Subsequently, a mask having an aperture at which the transparent electrode 272 is to be formed is formed, and thereafter a transparent electrode film (e.g., made of ITO) is formed by sputtering. Then by lifting off the mask, the transparent electrode 272 completes as shown in FIG. 7.

In connecting an light-absorptive structures either in series or in parallel, the wire 278 is formed to connect the light-absorptive structure C1 to the light-absorptive structure C2 as shown in FIG. 2. For example, a mask having an aperture at which the wire 278 is to be formed is formed, and thereafter a metal film (e.g., made of Al) is evaporated by vacuum evaporation. The wire 278 completes by lifting off the mask.

In the photoelectric conversion device 200 shown in FIG. 2, the wire 278 is used to connect the transparent electrode 272 of the light-absorptive structure C2 to the well 203 of the light-absorptive structure C1, thereby connecting the two light-absorptive structures in series. In the photoelectric conversion device 200, it is also possible to connect the light-absorptive structure C1 to the light-absorptive structure C2 in parallel, by means of the wire 278. For example, by forming the light-absorptive structure C1 and the light-absorptive structure C2 to be respectively in contact with a conductive Si base wafer 202 without forming the wells 203, the first semiconductors 210 of these two light-absorptive structures can be connected to each other via the base wafer 202. By connecting the transparent electrodes of the light-absorptive structure C1 and the light-absorptive structure C2 via the wire in this state, the two light-absorptive structures can be connected in parallel.

The two or more apertures for forming the two or more light-absorptive structures to be connected in parallel may be connected within the range not degrading the crystallinity. Connecting the apertures is desirable because there will be a structure similar to a device can be formed therebetween, to eliminate effect of difference in levels during formation of the wire. For example, assume there are several 20 μm×20 μm square apertures. By connecting adjacent apertures via a narrow aperture of about 3 μm for example, the upper wire can be connected easily without being affected by the difference in levels.

Figure 8:
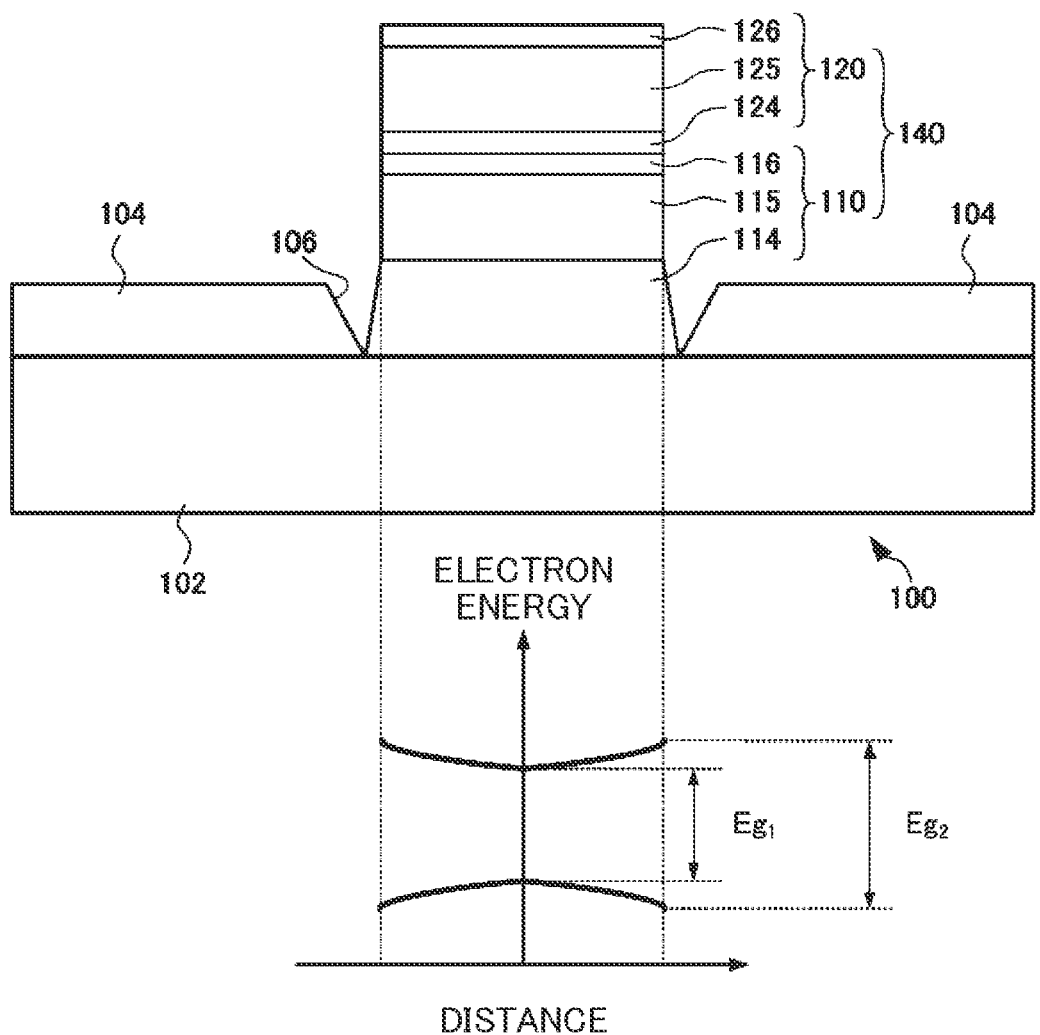
FIG. 8 shows an example of an energy band of the light-absorptive structure in the semiconductor wafer 100.

FIG. 8 shows an example of an energy band of the light-absorptive structure in the semiconductor wafer 100. The upper part of FIG. 8 shows a cross section of the semiconductor wafer 100. The lower part of FIG. 8 shows an energy band of the first semiconductor 110 or the second semiconductor 120. The horizontal axis shows an in-plane position parallel to the base wafer 102, of the first semiconductor 110 or the second semiconductor 120. The vertical axis shows an energy band of the first semiconductor 110 or the second semiconductor 120. The lower curve represents the upper edge of the valence band and the upper curve represents the lower edge of the conduction band. The interval between the upper curve and the lower curve represents the band gap.

The first semiconductor 110 or the second semiconductor 120 has a composition distribution causing a larger band gap at position within the respective planes parallel to the base wafer 102 which is distanced farther from the centers of the respective planes parallel to the base wafer 102. In other words, the first semiconductor 110 and the second semiconductor 120 have a composition distribution causing a larger band gap at a periphery compared to the central portion.

For example, for the first semiconductor 110 or the second semiconductor 120, there are a band gap of $Eg_1$ at the central portion of the first semiconductor 110, and a band gap of $Eg_2$ larger than $Eg_1$ at the periphery, as shown in FIG. 8. When the first semiconductor 110 is SiGe, by gradually increasing the composition of Si from the central portion towards the periphery, the band gap changes as shown in FIG. 8. When the second semiconductor 120 is InGaAs, by gradually decreasing the composition of In and increasing the composition of Ga from the central portion towards the periphery, the band gap changes as shown in FIG. 8.

If the periphery of the first semiconductor 110 or the second semiconductor 120 has a band gap $Eg_g$ wider than that of the central portion, the recombination of the carrier generated by photoelectric conversion is restrained at the periphery. Any of the first semiconductor 210, the second semiconductor 220, and the third semiconductor 230 in the photoelectric conversion device 200 described above may have a band gap changing as shown in FIG. 8 in the plane parallel to the base wafer 202.

Figure 9:
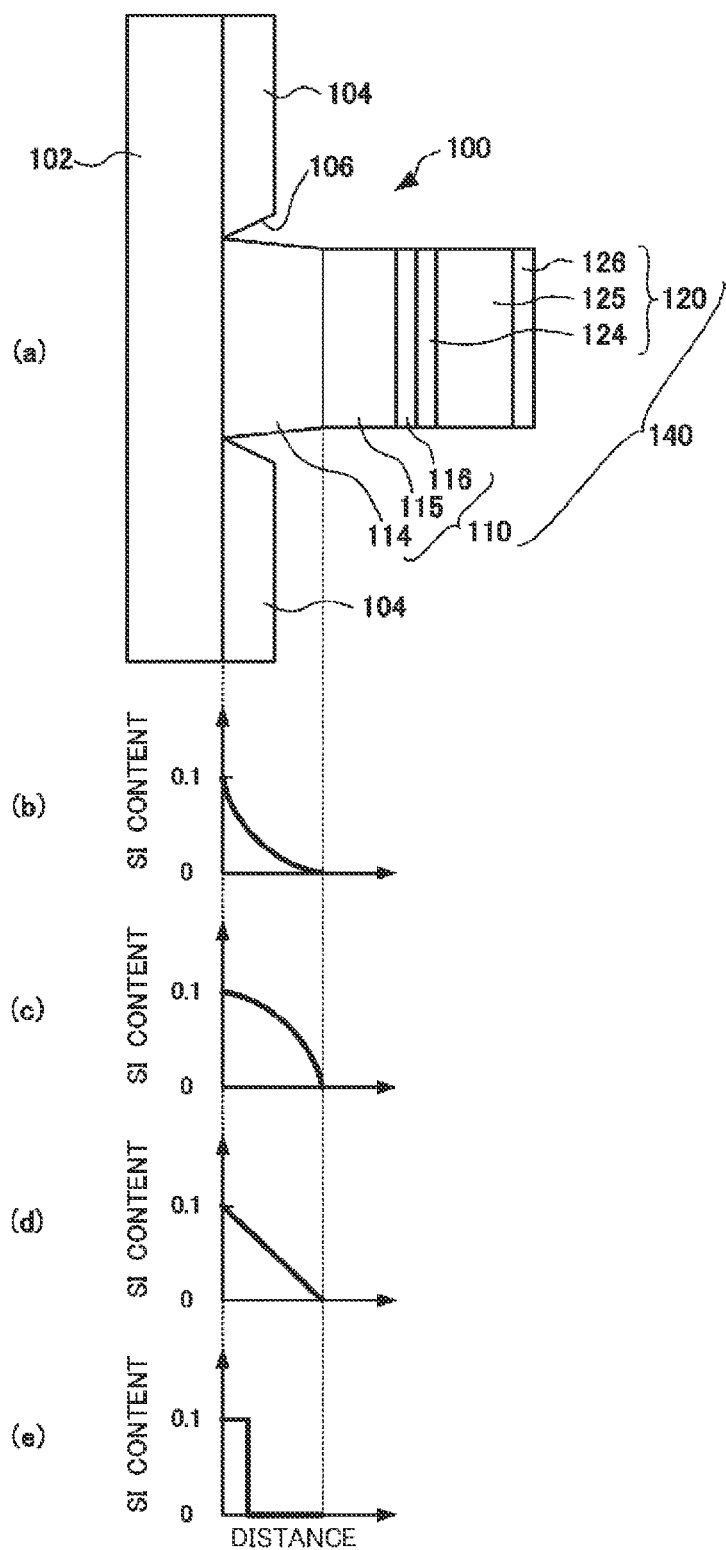
FIG. 9 shows an example of a composition distribution of a first semiconductor in the semiconductor wafer 100.

FIG. 9 shows an example of a composition distribution of a first semiconductor in the semiconductor wafer 100. FIG. 9 (a) shows a cross section of the semiconductor wafer 100. FIG. 9 (b) through FIG. 9 (e) respectively show composition distribution of the first-conductivity-type first semiconductor 114 included in the first semiconductor 110. The composition of the first semiconductor 110 changes according to the distance from the base wafer 102 in the direction in which the first semiconductor 110 and the second semiconductor 120 are stacked.

For example, when the first semiconductor 110 is SiGe and the second semiconductor 120 is Ge, the ratio of silicon decreases in the direction towards the second semiconductor from the plane in contact with the base wafer 102 of the first semiconductor 110. The change in composition of Si may continually change as shown in the examples from (b) through (d). The composition of Si may also change in a stepwise fashion as shown in (e).

It is preferable that the composition of Si in the first semiconductor 110 change in the first-conductivity-type first semiconductor 114, and not change in the low-carrier-concentration first semiconductor 115 and the second-conductivity-type first semiconductor 116. By doing so, the first-conductivity-type first semiconductor 114 will lattice-match the base wafer 102, and the second-conductivity-type first semiconductor 116 will lattice-match the first-conductivity-type second semiconductor 124.

By having a higher Si composition on the portion nearer the base wafer 102 containing Si and having a higher Ge composition on the portion nearer the second semiconductor 120 of Ge, the internal stress attributed to the difference in lattice constant between the base wafer 102 and the first semiconductor 110, and the second semiconductor 120 can be alleviated. As a result, the lattice defect such as dislocation due to the internal stress can be reduced, to improve the crystallinity.

Figure 10:
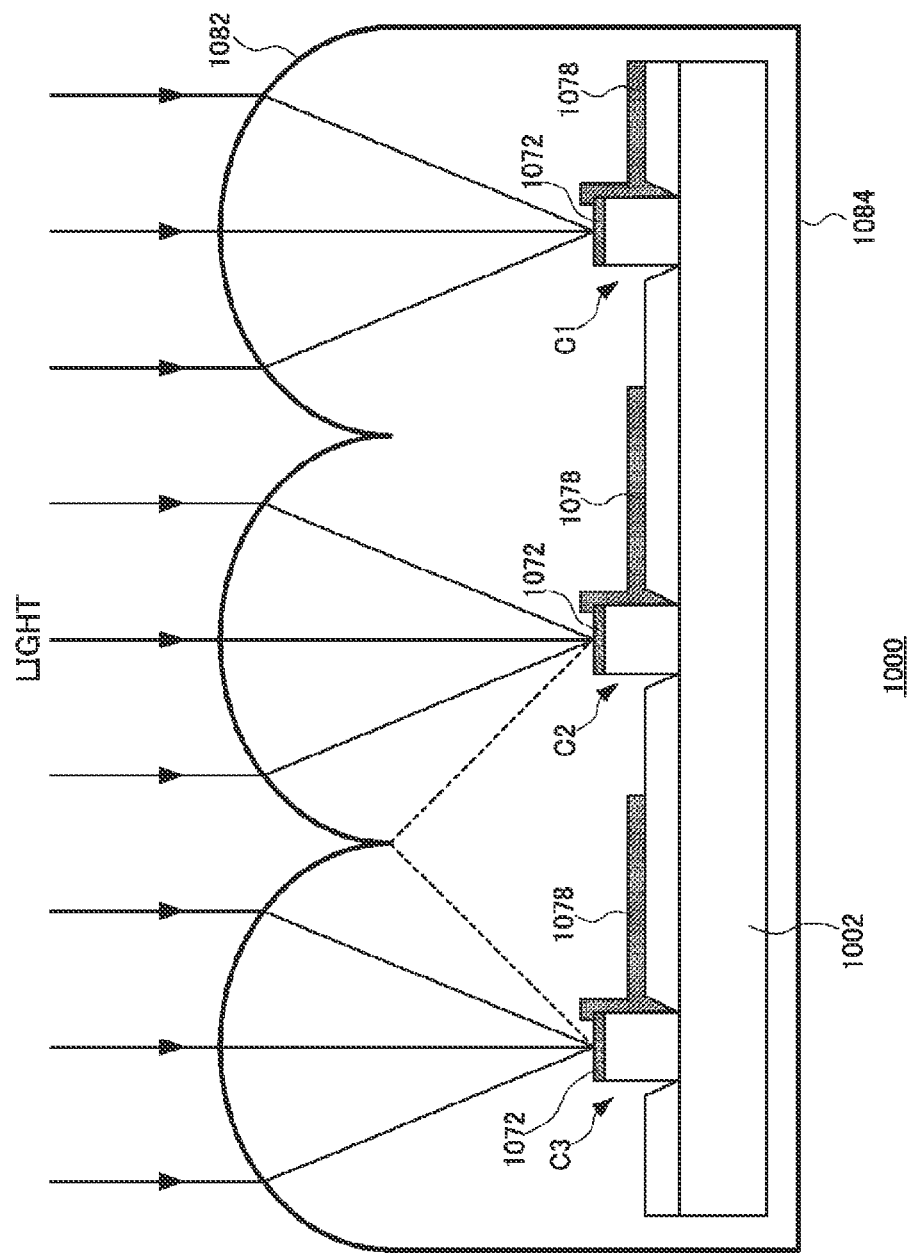
FIG. 10 shows an exemplary cross section of a photoelectric conversion device 1000.

FIG. 10 shows an exemplary cross section of a photoelectric conversion device 1000. The photoelectric conversion device 1000 includes a base wafer 1002, a transparent electrode 1072, a wire 1078, a light-absorptive structure C1, an light-absorptive structure C2, an light-absorptive structure C3, a light focusing member 1082, and a sealing member 1084. the base wafer 1002 corresponds to the base wafer 202 in the photoelectric conversion device 200. The transparent electrode 1072 corresponds to the transparent electrode 272. The wire 1078 corresponds to the wire 278. The light-absorptive structure C1, the light-absorptive structure C2, and the light-absorptive structure C3 correspond to and have the same configuration as the light-absorptive structure C1 of the photoelectric conversion device 200.

The light focusing member 1082 focuses light such that at least a part of the incident light will be incident on the light-absorptive structure C1, the light-absorptive structure C2, and the light-absorptive structure C3. The light focusing member 1082 is an optical lens, for example. The light focusing member 1082 may be made of a material that transmits light, such as glass, plastic, or the like. The light focusing member 1082 is a member having a lens effect of focusing light. The photoelectric conversion device 1000 may include a plurality of light focusing members 1082 each corresponding to one of the light-absorptive structures. The plurality of light focusing members 1082 may be integrally formed as shown in FIG. 10.

The light focusing member 1082 is provided at a position that enables the focused light to be incident on the light-absorptive structure C1, the light-absorptive structure C2, and the light-absorptive structure C3. The light focusing member 1082 has a color aberration, being a difference in focal length, corresponding to the first color region of the incident light, the second color region having a shorter wavelength region than the first color region, and the third color region having a shorter wavelength region than the second color region.

Figure 11:
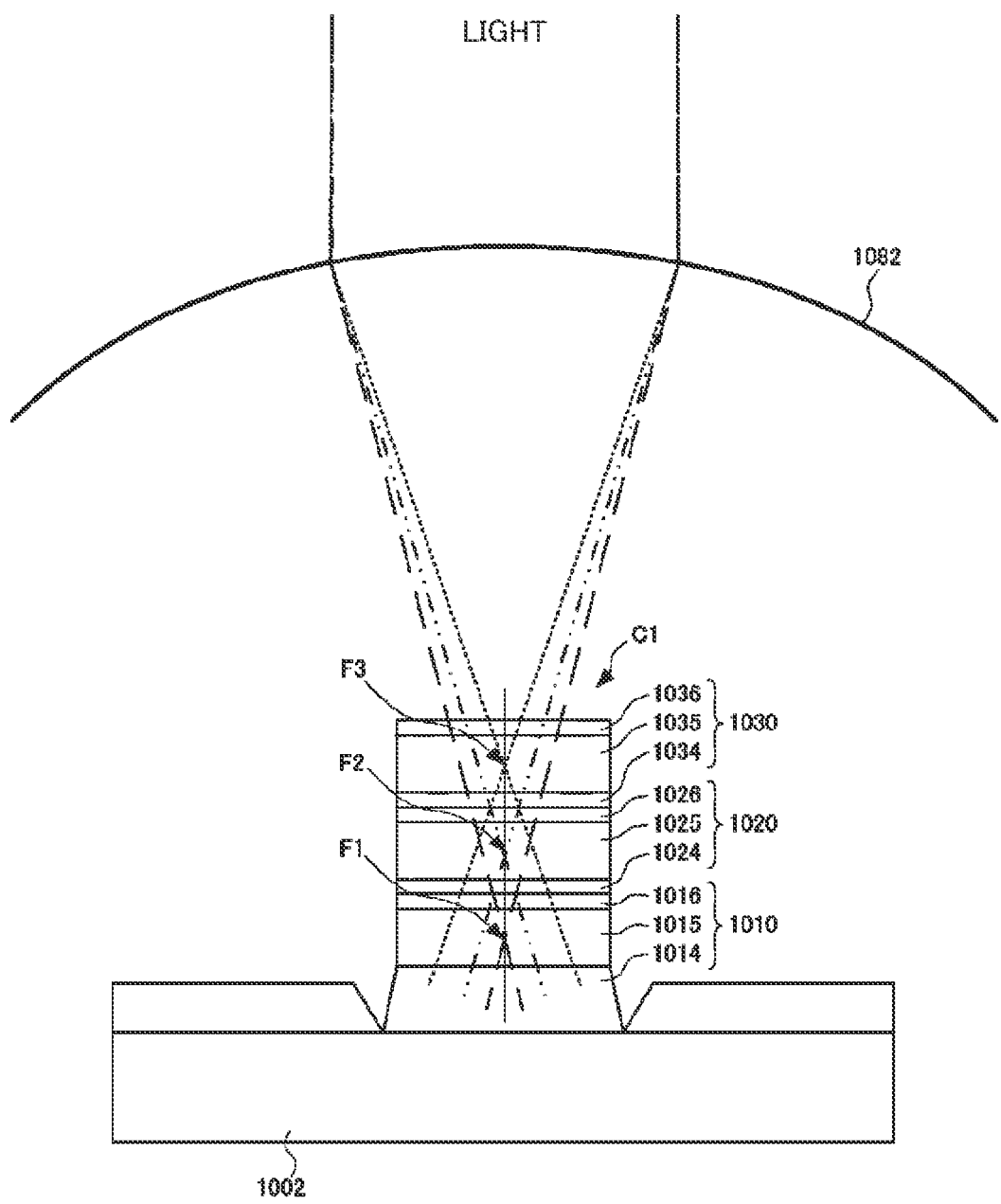
FIG. 11 shows a focal position of a light focusing member having color aberration.

FIG. 11 shows a focal position of a light focusing member having color aberration. FIG. 11 is an enlarged view of the portion of the light-absorptive structure C1 in FIG. 10. The light-absorptive structure C1 corresponds to and has the same configuration as the light-absorptive structure C1 in the photoelectric conversion device 200. In FIG. 11, some of the constituents are not shown.

The light-absorptive structure C1 has a three-layer tandem structure made of the first semiconductor 1010, the second semiconductor 1020, and the third semiconductor 1030. The semiconductor 1014, the semiconductor 1016, the semiconductor 1024, the semiconductor 1026, the semiconductor 1034, and the semiconductor 1036 respectively correspond to the first-conductivity-type first semiconductor 214, the second-conductivity-type first semiconductor 216, the first-conductivity-type second semiconductor 224, the second-conductivity-type second semiconductor 226, the first-conductivity-type third semiconductor 234, and the second-conductivity-type third semiconductor 236 of the photoelectric conversion device 200.

The light focusing member 1082 has color aberration, and its focal points respectively corresponding to light of wavelengths distribute throughout a certain range as shown in F01, F02, and F03, as shown in FIG. 11. The focal position F01 of the light focusing member 1082 for the light of the energy corresponding to the band gap of the first semiconductor 1010 is positioned in the first space-charge region in the first semiconductor 1010, i.e., low-carrier-concentration semiconductor 1015. The focal position F02 of the light focusing member 1082 for the light having an energy corresponding to the band gap of the second semiconductor 1020 is positioned in the second space-charge region in the second semiconductor 1020, i.e., low-carrier-concentration semiconductor 1025.

The focal point F03 of the light focusing member 1082 for the light having an energy corresponding to the band gap of the third semiconductor 1030 is positioned in the third space-charge region in the third semiconductor 1030, i.e., low-carrier-concentration semiconductor 1035. Because the focal positions for respective rays of light of the light focusing member 1082 are equal to the position of the first space-charge region, the position of the second space-charge region, and the position of the third space-charge region, the light-absorptive structure C1 can efficiently absorb the light having wavelengths corresponding to the band gaps respectively of the first semiconductor 1010, the second semiconductor 1020, and the third semiconductor 1030. Therefore, the photoelectric conversion efficiency of the photoelectric conversion device 1000 can be enhanced.

The light focusing member 1082 may further include an optical film absorbing or reflecting light of a longer wavelength than the wavelength corresponding to the band gap of the first semiconductor 1010, such that the optical film covers the surface of the light focusing member 1082. The photoelectric conversion device 1000 may further include a radiation resistant film containing heavy metal and selectively positioned on the path of light incident onto the light-absorptive structure C1 or the like, the light being focused by the light focusing member 1082. Such a radiation resistant film containing heavy metal may be provided on top of the transparent electrode 1072, for example.

The sealing member 1084 integrally seals the photoelectric conversion device 1000, as shown in FIG. 10. The sealing member 1084 may be made by a transparent material such as glass, plastic, or the like. The sealing member 1084 may be integrally formed with the light focusing member 1082. The light focusing member 1082 may be retained by the sealing member 1084.

The wire 1078 corresponds to the wire 278 of the photoelectric conversion device 200. The wire 1078 is connected to the transparent electrode 1072 provided for the light-absorptive structure C1 or the like at the side from which the incident light enters. The wire 1078 is provided so as not to overlap the path along which the incident light is incident to the transparent electrode 1072, as shown in FIG. 10. Therefore, the wire 1078 may be positioned in the shadow portion made due to the focusing incident light by the light focusing member 1082. Specifically, the wire 1078 may be positioned in the region corresponding to the shadow portion that is below the broken line of FIG. 10. According to this positioning of the wire 1078, the light focused by the light focusing member 1082 will not be blocked by the wire when it is to be incident on the light-absorptive structure, and therefore the photoelectric conversion device 1000 can efficiently pursue photoelectric conversion.

Figure 12:
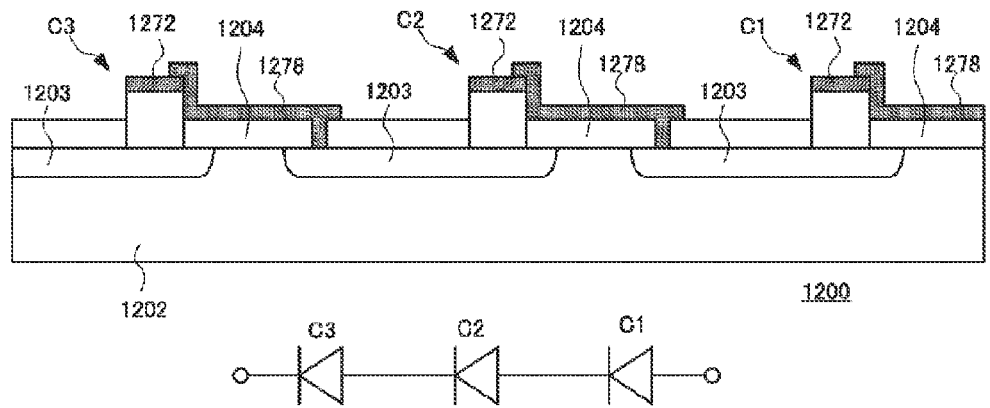
FIG. 12 shows an exemplary cross section of a photoelectric conversion device 1200.

FIG. 12 shows an exemplary cross section of a photoelectric conversion device 1200. The upper part of FIG. 12 shows a cross section of the photoelectric conversion device 1200. The lower part of FIG. 12 shows a corresponding circuitry diagram showing a connection status of the light-absorptive structure C1, the light-absorptive structure C2, and the light-absorptive structure C3. The photoelectric conversion device 1200 includes a base wafer 1202, a well 1203, an inhibitor 1204, a transparent electrode 1272, a wire 1278, an light-absorptive structure C1, an light-absorptive structure C2, and an light-absorptive structure C3.

The base wafer 1202 corresponds to the base wafer 202 of the photoelectric conversion device 200. The well 1203 corresponds to the well 203. The transparent electrode 1272 corresponds to the transparent electrode 272. The wire 1278 corresponds to the wire 278. The light-absorptive structure C1, the light-absorptive structure C2, and the light-absorptive structure C3 correspond to the light-absorptive structure C1 of the photoelectric conversion device 200.

As shown in FIG. 12, in the photoelectric conversion device 1200, the transparent electrode 1272 of the light-absorptive structure C3 is connected via the wire 1278 to the well 1203 formed under the light-absorptive structure C2, and the transparent electrode 1272 of the light-absorptive structure C2 is connected via the wire 1278 to the well 1203 formed under the light-absorptive structure C1. That is, the light-absorptive structure C1, the light-absorptive structure C2, and the light-absorptive structure C3 are connected in series, as shown in the corresponding circuitry diagram in the lower part of FIG. 12. In this case, the electric power generated by the photoelectric conversion device 1200 can be taken out as electromotive force between the transparent electrode 1272 of the light-absorptive structure C1 and the well 1203 of the light-absorptive structure C3. Although FIG. 12 shows an example in which three light-absorptive structures are connected in series, more light-absorptive structures may be connected in series.

Figure 13:
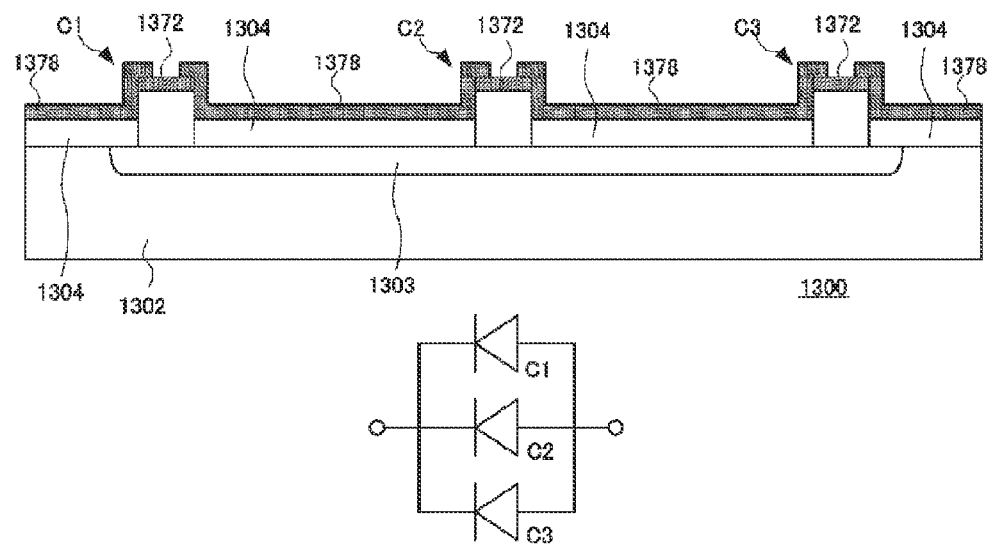
FIG. 13 shows an exemplary cross section of a photoelectric conversion device 1300.

FIG. 13 shows an exemplary cross section of a photoelectric conversion device 1300. The upper part of FIG. 13 shows a cross section of the photoelectric conversion device 1300. The lower part of FIG. 13 shows a corresponding circuitry diagram showing a connection status of the light-absorptive structure C1, the light-absorptive structure C2, and the light-absorptive structure C3. The photoelectric conversion device 1300 includes a base wafer 1302, a well 1303, an inhibitor 1304, a transparent electrode 1372, a wire 1378, an light-absorptive structure C1, an light-absorptive structure C2, and an light-absorptive structure C3.

The base wafer 1302 corresponds to the base wafer 202 of the photoelectric conversion device 200. The well 1303 corresponds to the well 203. The transparent electrode 1372 corresponds to the transparent electrode 272. The wire 1378 corresponds to the wire 278. The light-absorptive structure C1, the light-absorptive structure C2, and the light-absorptive structure C3 correspond to the light-absorptive structure C1 of the photoelectric conversion device 200.

As shown in FIG. 13, in the photoelectric conversion device 1300, the transparent electrodes 1372 of the light-absorptive structure C1, the light-absorptive structure C2, and the light-absorptive structure C3 are connected to each other, by means of the wire 1378. In addition, in the photoelectric conversion device 1300, the light-absorptive structure C1, the light-absorptive structure C2, and the light-absorptive structure C3 are electrically connected to each other by means of the well 1303 formed thereunder. That is, the light-absorptive structure C1, the light-absorptive structure C2, and the light-absorptive structure C3 are connected in parallel, as shown in the corresponding circuitry diagram in the lower part of FIG. 13.

In this case, the electric power generated by the photoelectric conversion device 1300 can be taken out as electromotive force between the transparent electrode 1372 and the well 1303. Although FIG. 13 shows an example in which three light-absorptive structures are connected in parallel, more light-absorptive structures may be connected in parallel.

A plurality of light-absorptive structures connected to each other either in series or in parallel can be further connected either in series or in parallel to another plurality of light-absorptive structures connected to each other either in series or in parallel.

In the above-described embodiments, a inhibitor having apertures is formed on the wafer containing Si, and the first semiconductor, the second semiconductor, and the third semiconductor are selectively formed in the apertures by an epitaxial growth method. Consequently, the lattice defects attributed to difference in lattice constant between Si and the compound semiconductor can be reduced, to obtain an light-absorptive structure having a tandem structure having a high crystallinity. Because of enhanced crystallinity of the light-absorptive members, a photoelectric conversion device having a high photoelectric efficiency has been obtained. In addition, by combining light focusing members, light can be focused efficiently to be incident to the light-absorptive members, thereby further enhancing the photoelectric conversion efficiency of the photoelectric conversion devices.

The invention claimed is:

1. A semiconductor wafer comprising:
a base wafer containing silicon;
an inhibitor that has been formed on the base wafer, has an aperture in which a surface of the base wafer is exposed, and inhibits crystal growth; and
a light-absorptive structure that has been formed inside the aperture in contact with a surface of the base wafer exposed inside the aperture, the light-absorptive structure including a first semiconductor, a second semiconductor, and a third semiconductor, wherein
the first semiconductor includes:
a first-conductivity-type first semiconductor;
a second-conductivity-type first semiconductor that has been formed directly or indirectly on the first-conductivity-type first semiconductor and has a conductivity type opposite to the conductivity type of the first-conductivity-type first semiconductor; and
a low-carrier-concentration first semiconductor that has been formed between the first-conductivity-type first semiconductor and the second-conductivity-type first semiconductor and is lower in effective carrier concentration than the first-conductivity-type first semiconductor and the second-conductivity-type first semiconductor,
the second semiconductor includes:
a first-conductivity-type second semiconductor that lattice-matches or pseudo-lattice- matches the second-conductivity-type first semiconductor and has a conductivity type opposite to the conductivity type of the second-conductivity-type first semiconductor;
a second-conductivity-type second semiconductor that has been formed directly or indirectly on the first-conductivity-type second semiconductor and has a conductivity type opposite to the conductivity type of the first-conductivity-type second semiconductor; and
a low-carrier-concentration second semiconductor that has been formed between the first-conductivity-type second semiconductor and the second-conductivity-type second semiconductor and is lower in effective carrier concentration than the first-conductivity-type second semiconductor and the second-conductivity-type second semiconductor, and
the third semiconductor includes:
a first-conductivity-type third semiconductor lattice-matching or pseudo-lattice-matching the second-conductivity-type second semiconductor;
a second-conductivity-type third semiconductor that has been formed directly or indirectly on the first-conductivity-type third semiconductor and has a conductivity type opposite to the conductivity type of the first-conductivity-type third semiconductor; and a low-carrier-concentration third semiconductor that has been formed between the first-conductivity-type third semiconductor and the second-conductivity-type third semiconductor and is lower in effective carrier concentration than the first-conductivity-type third semiconductor and the second-conductivity-type third semiconductor, wherein the light-absorptive structure excites a carrier under irradiation with light, and a recombination repressor layer repressing recombination of the carrier is provided in at least one position selected from between the base wafer and the first-conductivity-type first semiconductor; between the second-conductivity-type first semiconductor and the first-conductivity-type second semiconductor; between the second-conductivity-type second semiconductor and the first-conductivity-type third semiconductor; and on a plane opposite to a plane of the second-conductivity-type third semiconductor, the latter plane being in contact with the low-carrier-concentration third semiconductor.

2. The semiconductor wafer as set forth in claim 1, further comprising:

a recombination repressor that has been formed in contact with a side wall of the light-absorptive structure and represses recombination of the carrier on the side wall.

3. A semiconductor wafer comprising:

a base wafer containing silicon;

an inhibitor that has been formed on the base wafer, has an aperture in which a surface of the base wafer is exposed, and inhibits crystal growth; and a light-absorptive structure that has been formed inside the aperture in contact with a surface of the base wafer exposed inside the aperture, the light-absorptive structure including a first semiconductor, a second semiconductor, and a third semiconductor, wherein the first semiconductor includes:

a first-conductivity-type first semiconductor;

a second-conductivity-type first semiconductor that has been formed directly or indirectly on the first-conductivity-type first semiconductor and has a conductivity type opposite to the conductivity type of the first-conductivity-type first semiconductor; and a low-carrier-concentration first semiconductor that has been formed between the first- conductivity-type first semiconductor and the second-conductivity-type first semiconductor and is lower in effective carrier concentration than the first-conductivity-type first semiconductor and the second-conductivity-type first semiconductor, the second semiconductor includes:

a first-conductivity-type second semiconductor that lattice-matches or pseudo-lattice-matches the second-conductivity-type first semiconductor and has a conductivity type opposite to the conductivity type of the second-conductivity-type first semiconductor;

a second-conductivity-type second semiconductor that has been formed directly or indirectly on the first-conductivity-type second semiconductor and has a conductivity type opposite to the conductivity type of the first-conductivity-type second semiconductor; and a low-carrier-concentration second semiconductor that has been formed between the first-conductivity-type second semiconductor and the second-conductivity-type second semiconductor and is lower in effective carrier concentration than the first-conductivity-type second semiconductor and the second-conductivity-type second semiconductor, and the third semiconductor includes:

a first-conductivity-type third semiconductor lattice-matching or pseudo-lattice-matching the second-conductivity-type second semiconductor;

a second-conductivity-type third semiconductor that has been formed directly or indirectly on the first-conductivity-type third semiconductor and has a conductivity type opposite to the conductivity type of the first-conductivity-type third semiconductor; and a low-carrier-concentration third semiconductor that has been formed between the first-conductivity-type third semiconductor and the second-conductivity-type third semiconductor and is lower in effective carrier concentration than the first-conductivity-type third semiconductor and the second-conductivity-type third semiconductor, wherein the first semiconductor is made of $C_{x1}Si_{y1}Ge_{z1}Sn_{1-x1-y1-z1}$ ($0 \le x1 \le 1$, $0 \le y1 \le 1$, $0 \le z1 \le 1$, and $0 < x1+y1+z1 \le 1$) having a first band gap, the second semiconductor is made of $Al_{x2}In_{y2}Ga_{1-x2-y2}As_{z2}P_{w1}N_{1-z2-w1}$ ($0 \le x2 \le 1$, $0 \le y2 \le 1$, $0 \le x2+y2 \le 1$, $0 \le z2 \le 1$, $0 \le w1 \le 1$, and $0 \le z2+w1 \le 1$), having a second band gap larger than the first band gap, and the third semiconductor is made of $Al_{x3}In_{y3}Ga_{1-x3-y3}As_{z3}P_{1-z3}$ ($0 \le x3 \le 1$, $0 \le y3 \le 1$, $0 \le z3 \le 1$, and $0 \le x3+y3 \le 1$) having a third band gap larger than the second band gap.

4. A semiconductor wafer comprising:

a base wafer containing silicon;

an inhibitor that has been formed on the base wafer, has an aperture in which a surface of the base wafer is exposed, and inhibits crystal growth; and a light-absorptive structure that has been formed inside the aperture in contact with a surface of the base wafer exposed inside the aperture, the light-absorptive structure including a first semiconductor, a second semiconductor, and a third semiconductor, wherein the first semiconductor includes:

a first-conductivity-type first semiconductor;

a second-conductivity-type first semiconductor that has been formed directly or indirectly on the first-conductivity-type first semiconductor and has a conductivity type opposite to the conductivity type of the first-conductivity-type first semiconductor; and a low-carrier-concentration first semiconductor that has been formed between the first-conductivity-type first semiconductor and the second-conductivity-type first semiconductor and is lower in effective carrier concentration than the first-conductivity-type first semiconductor and the second-conductivity-type first semiconductor, the second semiconductor includes:

a first-conductivity-type second semiconductor that lattice-matches or pseudo-lattice-matches the second-conductivity-type first semiconductor and has a conductivity type opposite to the conductivity type of the second-conductivity-type first semiconductor;

a second-conductivity-type second semiconductor that has been formed directly or indirectly on the first-conductivity-type second semiconductor and has a conductivity type opposite to the conductivity type of the first-conductivity-type second semiconductor; and a low-carrier-concentration second semiconductor that has been formed between the first-conductivity-type second semiconductor and the second-conductivity-type second semiconductor and is lower in effective carrier concentration than the first-conductivity-type second semiconductor and the second-conductivity-type second semiconductor, and the third semiconductor includes:

a first-conductivity-type third semiconductor lattice-matching or pseudo-lattice-matching the second-conductivity-type second semiconductor;

a second-conductivity-type third semiconductor that has been formed directly or indirectly on the first-conductivity-type third semiconductor and has a conductivity type opposite to the conductivity type of the first-conductivity-type third semiconductor; and a low-carrier-concentration third semiconductor that has been formed between the first-conductivity-type third semiconductor and the second-conductivity-type third semiconductor and is lower in effective carrier concentration than the first-conductivity-type third semiconductor and the second-conductivity-type third semiconductor, wherein one or more semiconductors selected from among the first semiconductor, the second semiconductor, and the third semiconductor have a composition distribution that causes a larger band gap at position distanced farther from the centers of planes respectively of the first semiconductor, the second semiconductor, and the third semiconductor that are parallel to the base wafer.

* * * * *